United States Patent
Yokokawa et al.

(10) Patent No.: US 7,318,186 B2
(45) Date of Patent: Jan. 8, 2008

(54) DECODING METHOD, DECODING APPARATUS, AND PROGRAM TO DECODE LOW DENSITY PARITY CHECK CODES

(75) Inventors: Takahsi Yokokawa, Tokyo (JP); Makiko Kan, Tokyo (JP); Yasuhiro Iida, Tokyo (JP); Atsushi Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 36 days.

(21) Appl. No.: 10/521,191

(22) PCT Filed: Apr. 19, 2004

(86) PCT No.: PCT/JP2004/005551

§ 371 (c)(1),
(2), (4) Date: Jan. 12, 2005

(87) PCT Pub. No.: WO2004/102810

PCT Pub. Date: Nov. 25, 2004

(65) Prior Publication Data
US 2005/0278604 A1   Dec. 15, 2005

(30) Foreign Application Priority Data
May 13, 2003   (JP)  ............................. 2003-133942

(51) Int. Cl.
  *H03M 13/00*   (2006.01)
(52) U.S. Cl. ..................................... 714/758
(58) Field of Classification Search .................. 714/758
See application file for complete search history.

(56) References Cited

U.S. PATENT DOCUMENTS 6,539,367 B1 *  3/2003  Blanksby et al. ............. 706/14

(Continued)

FOREIGN PATENT DOCUMENTS

JP   2002-33670   1/2002

(Continued)

OTHER PUBLICATIONS

Permutation Matrix. http://planetmath.org/encyclopedia/permutationmatrix.html.*

(Continued)

*Primary Examiner*—Guy Lamarre
*Assistant Examiner*—Sam Rizk
(74) *Attorney, Agent, or Firm*—Finnegan, Henderson, Farabow, Garrett & Dunner, L.L.P.

(57) ABSTRACT

The present invention relates to a decoding method and a decoding apparatus in which, while the circuit scale is suppressed, the operating frequency can be suppressed within a sufficiently feasible range, and control of memory access can be performed easily, and to a program therefor. By using a transformation check matrix obtained by performing one of or both a row permutation and a column permutation on an original check matrix of LDPC (Low Density Parity Check) codes, the LDPC codes are decoded. In this case, by using, as a formation matrix, a P×P unit matrix, a quasi-unit matrix in which one or more 1s, which are elements of the unit matrix, are substituted with 0, a shift matrix in which the unit matrix or the quasi-unit matrix is cyclically shifted, a sum matrix, which is the sum of two or more of the unit matrix, the quasi-unit matrix, and the shift matrix, and a P×P 0-matrix, the transformation check matrix is represented by a combination of a plurality of the formation matrices. A check node calculator 302 simultaneously performs p check node calculations. A variable node calculator 304 simultaneously performs p variable node calculations.

20 Claims, 22 Drawing Sheets

U.S. PATENT DOCUMENTS

| | | | |
|---|---|---|---|
| 6,633,856 B2 * | 10/2003 | Richardson et al. | 706/15 |
| 6,785,863 B2 * | 8/2004 | Blankenship et al. | 714/799 |
| 6,938,196 B2 * | 8/2005 | Richardson et al. | 714/752 |
| 6,957,375 B2 * | 10/2005 | Richardson | 714/752 |
| 6,961,888 B2 * | 11/2005 | Jin et al. | 714/752 |
| 7,058,873 B2 * | 6/2006 | Song et al. | 714/752 |
| 2002/0116677 A1 | 8/2002 | Morelos-Zaragoza | |
| 2002/0186759 A1 * | 12/2002 | Goldstein et al. | 375/222 |
| 2004/0034828 A1 * | 2/2004 | Hocevar | 714/800 |
| 2004/0119845 A1 * | 6/2004 | Kaku | 348/231.99 |
| 2004/0187129 A1 * | 9/2004 | Richardson | 718/100 |
| 2005/0050435 A1 * | 3/2005 | Kyung et al. | 714/800 |
| 2005/0278606 A1 * | 12/2005 | Richardson et al. | 714/760 |
| 2007/0143657 A1 * | 6/2007 | Kanaoka et al. | 714/752 |

FOREIGN PATENT DOCUMENTS

| | | |
|---|---|---|
| JP | 2002-118474 | 4/2002 |
| JP | 2004-147318 | 5/2004 |

OTHER PUBLICATIONS

Permutation matrix. http://en.wikipedia.org/wiki.permutation_matrix.*

Permutation Matrix. http://mathword.wolfarm.com/permutationmatrix.html.*

Robert G. Gallager, *Low-Density Parity Check Codes* (M. I. T. Press 1963).

David J. C. MacKay, "Good Error-Correcting Codes Based on Very Sparse Matrices," *IEEE Transactions on Information Theory*, vol. 45, No. 2, pp. 399-431, Mar. 1999.

Michael G. Luby, Michael Mitzenmacher, M. Amin Shokrollahi & Daniel A. Spielman, "Analysis of Low Density Codes and Improved Design Using Irregular Graphs," *Proceedings of ACM Symposium on Theory of Computing*, pp. 249-258 (1998).

C. Howland & A. Blanksby, "Parallel Decoding Architectures for Low Density Parity Check Codes," *Symposium on Circuits and Systems*, part IV, pp. 742-745 (2001).

Engling Yeo, Payam Pakzad, Borivoje Nikolic & Venkat Anantharam, "VLSI Architectures for Iterative Decoders in Magnetic Recording Channels," *IEEE Transactions on Magnetics*, vol. 37, No. 2, pp. 748-755, Mar. 2001.

* cited by examiner

FIG. 1 - Prior Art

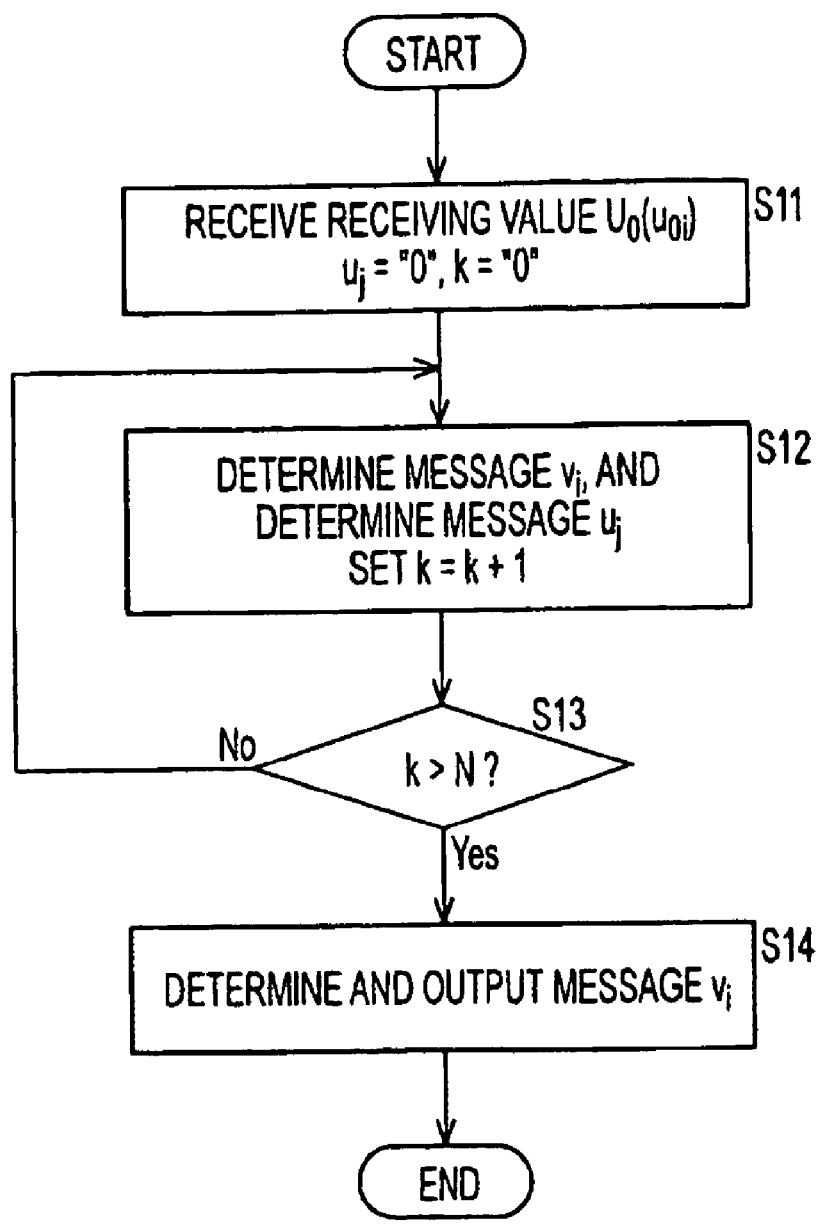

FIG. 3 - Prior Art
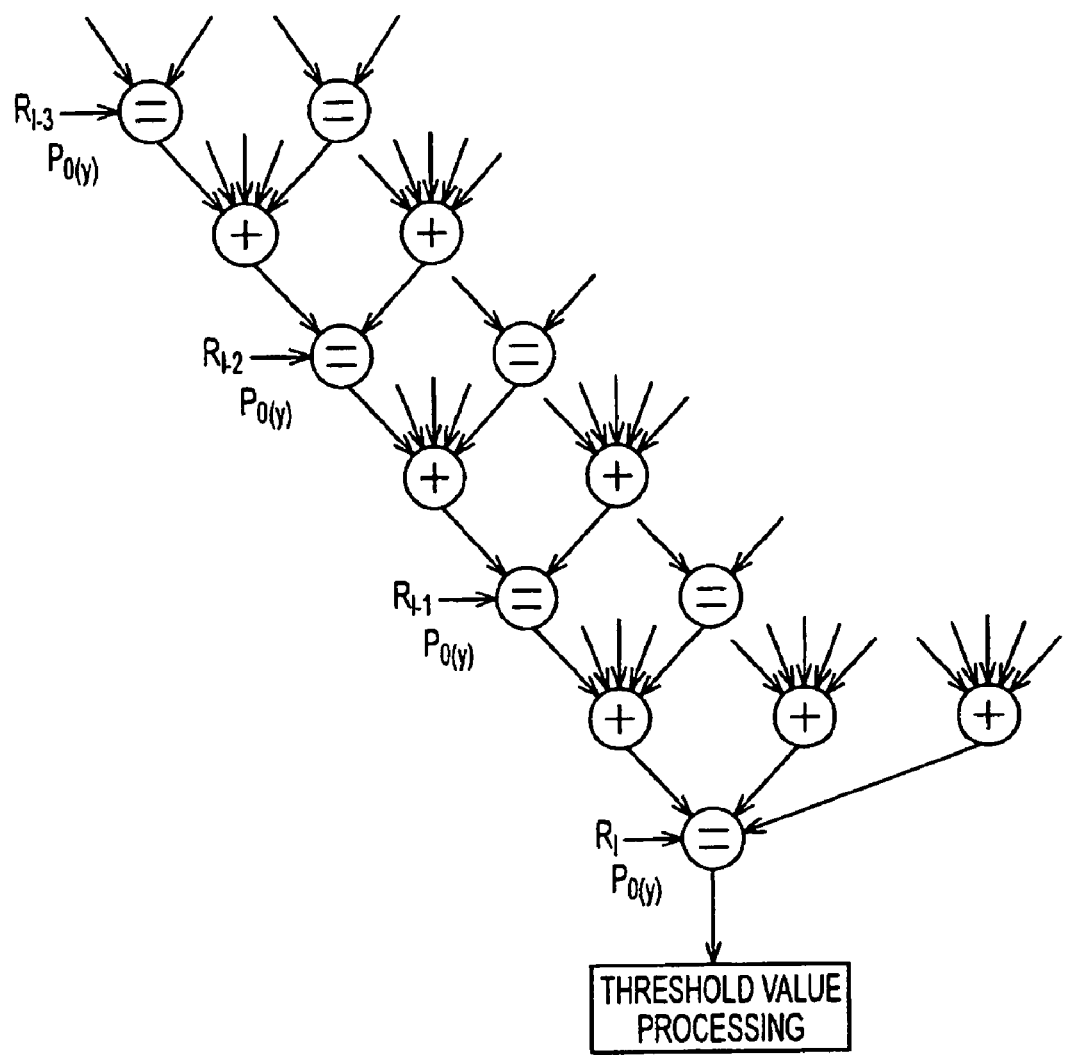

FIG. 4 - Prior Art $$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 5 - Prior Art
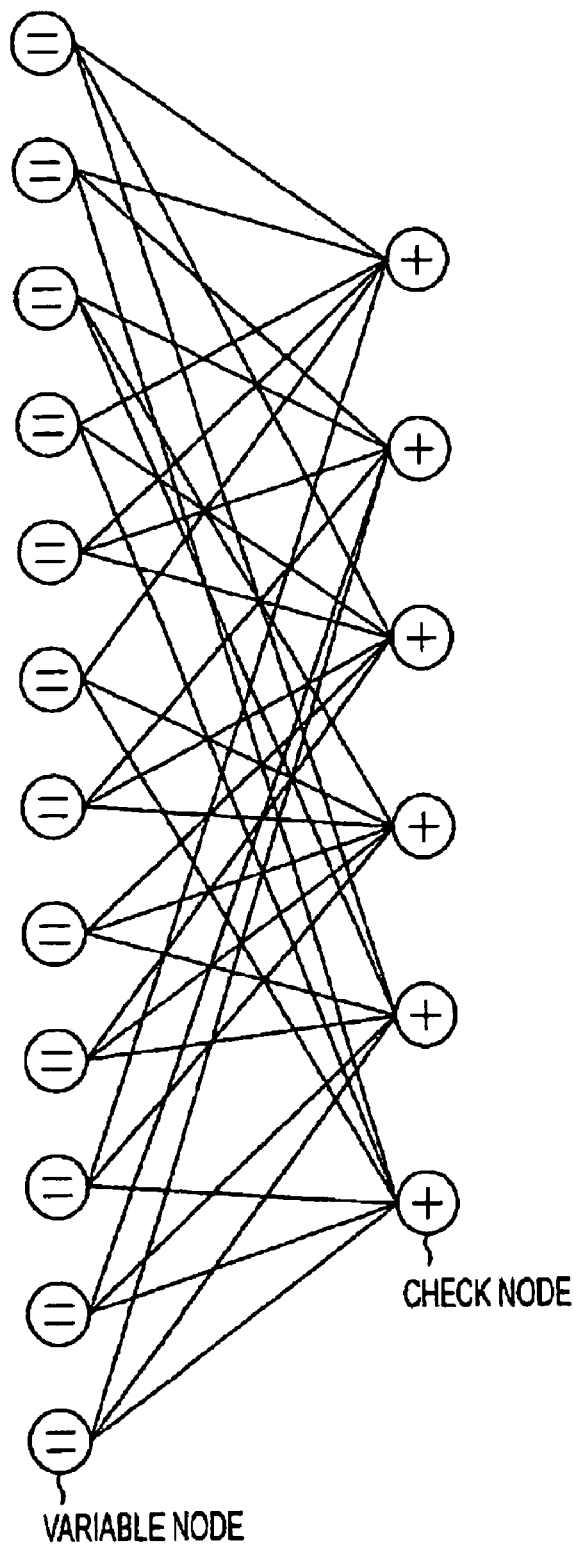

FIG. 6 - Prior Art
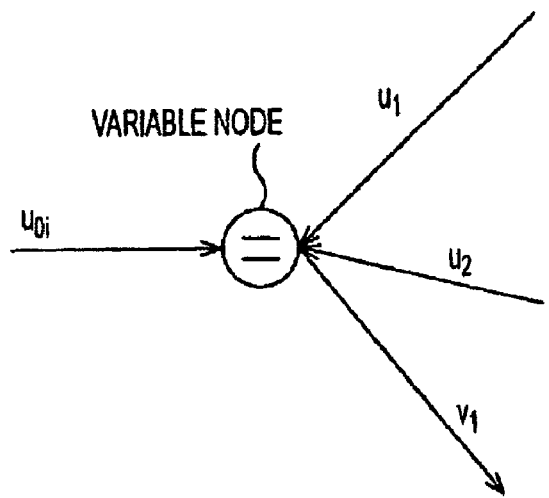
FIG. 7 - Prior Art
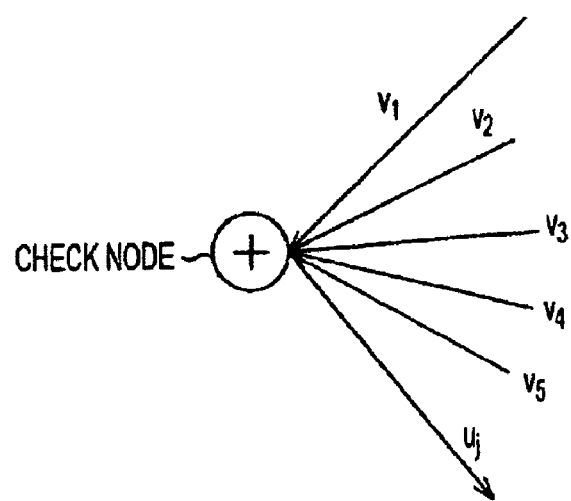

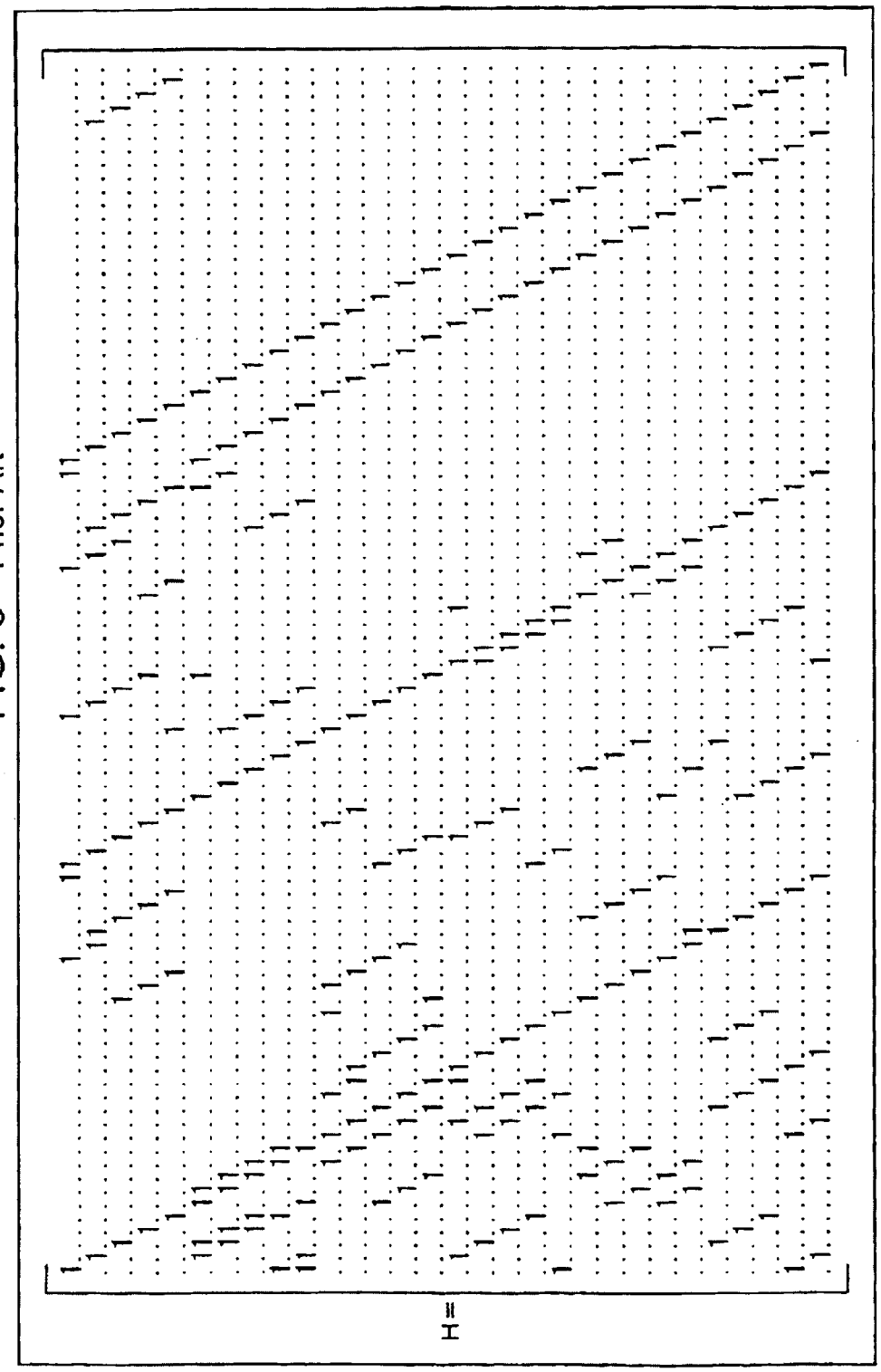
FIG. 8 - Prior Art

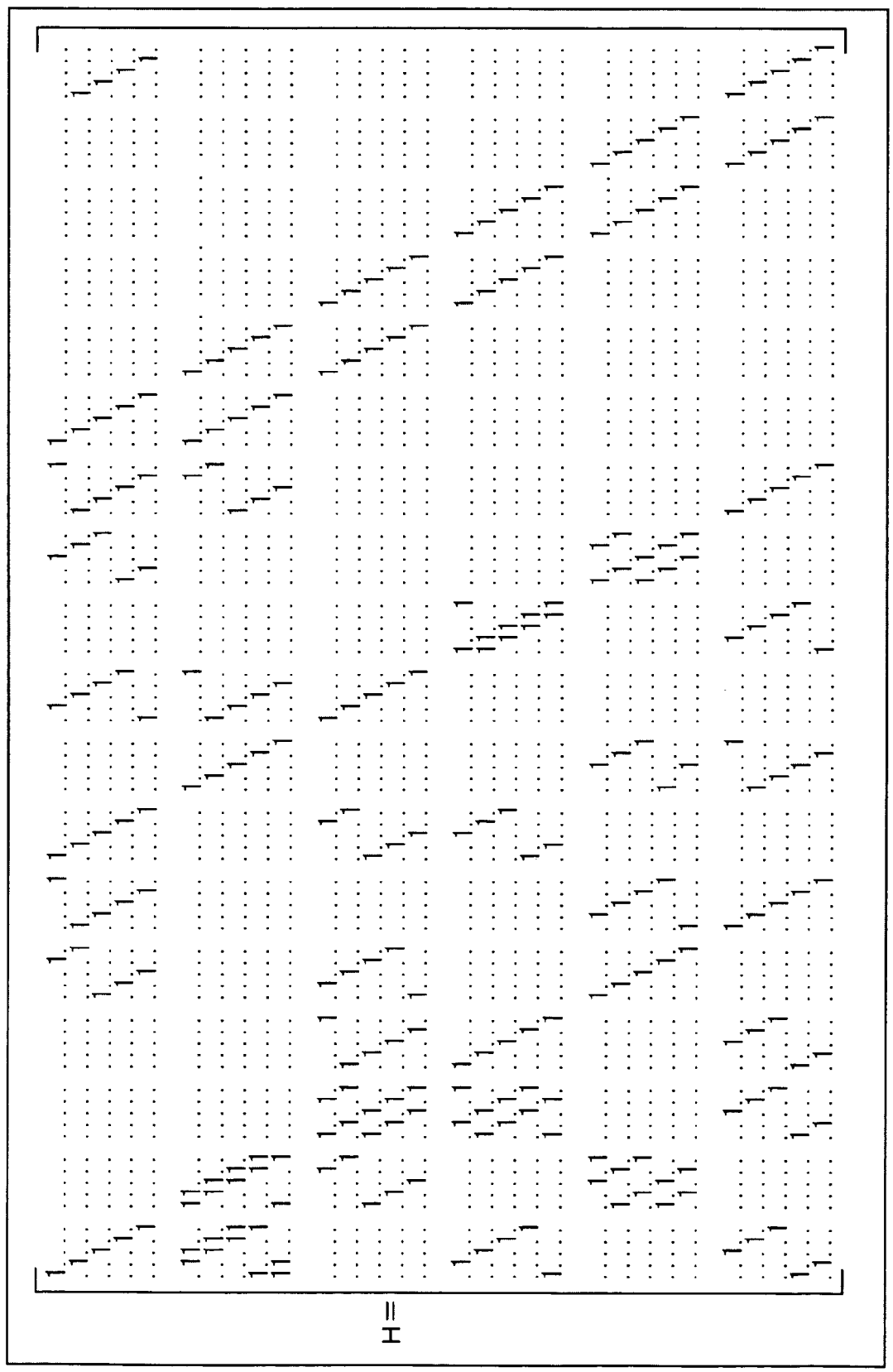

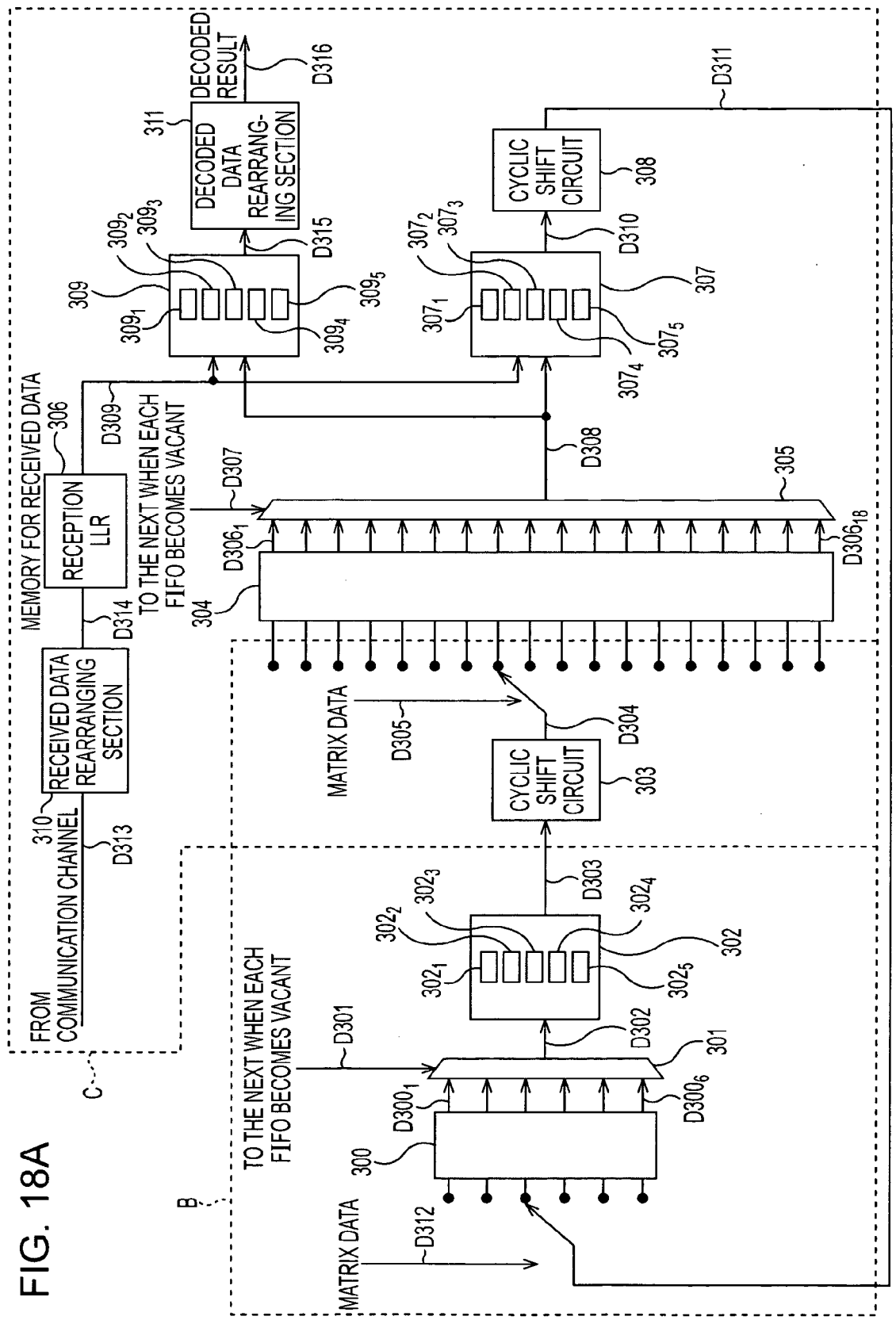

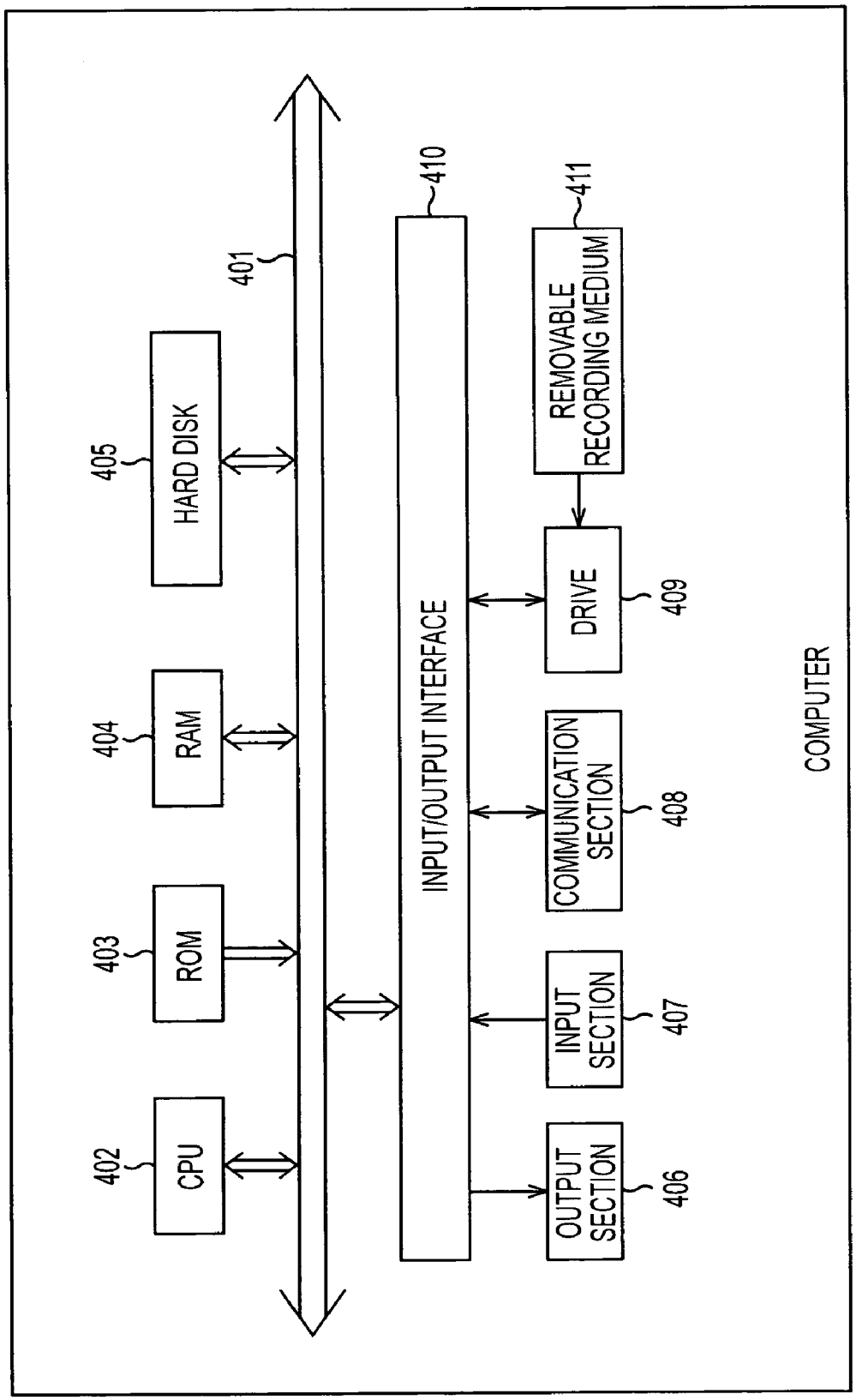

DECODING METHOD, DECODING APPARATUS, AND PROGRAM TO DECODE LOW DENSITY PARITY CHECK CODES

TECHNICAL FIELD

The present invention relates to a decoding method, a decoding apparatus, and a program. More particularly, the present invention relates to a decoding method and a decoding apparatus for decoding codes on which coding is performed using low density parity check codes, and to a program therefor.

BACKGROUND ART

In recent years, research in, for example, communication fields such as mobile communication and deep space communication, and broadcasting fields such as terrestrial-wave or satellite digital broadcasts has progressed remarkably. Along with this situation, research on coding theories for making error correction coding and decoding efficient has been actively carried out.

As a theoretical limit of code performance, the Shannon limit implied by the so-called Shannon's (C. E. Shannon) channel coding theorem is known. Research on coding theories has been carried out for the purpose of developing codes exhibiting performance near this Shannon limit. In recent years, as a coding method exhibiting performance near the Shannon limit, for example, techniques for what is commonly called "turbo coding", such as parallel concatenated convolutional codes (PCCC) and serially concatenated convolutional codes (SCCC), have been developed. Furthermore, whereas this turbo coding has been developed, low density parity check codes (hereinafter referred to as "LDPC codes"), which is a coding method that has been known for a long time, have attracted attention.

LDPC codes were proposed first in R. G. Gallager, "Low Density Parity Check Codes", Cambridge, Mass.: M. I. T. Press, 1963. Thereafter, LDPC codes reattracted attention in D. J. C. MacKay, "Good error correcting codes based on very sparse matrices", submitted to IEEE Trans. Inf. Theory, IT-45, pp. 399-431, 1999, and M. G. Luby, M. Mitzenmacher, M. A. Shokrollahi and D. A. Spielman, "Analysis of low density codes and improved designs using irregular graphs", in Proceedings of ACM Symposium on Theory of Computing, pp. 249-258, 1998.

It is beginning to be known from this recent research that, for the LDPC codes, as the code length increases, performance close to the Shannon limit can be obtained, similarly to turbo coding. Furthermore, since the LDPC codes have the property that the minimum length is proportional to the code length, they have the advantages that the block error probability characteristics are good, and a so-called error floor phenomenon, which is observed in decoding characteristics of turbo coding, hardly occurs.

Such LDPC codes will now be described in detail below. The LDPC codes are linear codes and do not always need to be two-dimensional, but here, a description is given assuming that the LDPC codes are two-dimensional.

The greatest features of the LDPC codes are that the parity check matrix that defines the LDPC codes are sparse. Here, a sparse matrix is formed in such a manner that the number of 1s in the elements of the matrix is very small. If the sparse check matrix is denoted as H, examples thereof include a check matrix in which, as shown in FIG. 1, the Hamming weight of each column (number of is; weight) is "3", and the Hamming weight of each row is "6".

As described above, the LDPC codes defined by the check matrix H in which the Hamming weight of each row and each column is fixed are called "regular LDPC codes". On the other hand, the LDPC codes defined by a check matrix H in which the Hamming weight of each row and each column is not fixed are called "irregular LDPC codes".

Coding by such LDPC codes is realized by generating a generation matrix G on the basis of the check matrix H and by generating a code word by multiplying this generation matrix G by a two-dimensional information message. More specifically, a coding apparatus for performing coding by LDPC codes computes a generation matrix G in which the equation $GH^T=0$ holds with a transpose matrix HT of the check matrix H. Here, when the generation matrix G is a k×n matrix, the coding apparatus multiplies the generation matrix G by a k-bit information matrix (vector u), and generates an n-bit codeword c (=uG). The codeword generated by this coding apparatus is transmitted with the code bit whose value is "0" being mapped to "+1" and the code bit whose value is "1" being mapped to "1", and is received at the reception side via a predetermined communication channel.

On the other hand, decoding of the LDPC codes can be performed by a message passing algorithm by belief propagation on a so-called Tanner graph, which is formed of a variable node (also called a message node) and a check node; this message passing algorithm was proposed by Gallager and is known as "probabilistic decoding". Hereafter, the variable nodes and the check nodes are also referred to simply as nodes where appropriate.

However, in probabilistic decoding, since messages exchanged between nodes are real-number values, in order to find an analytical solution, it is necessary to trace the probability distribution of the message that takes a continuous value. This necessitates analysis involving a large degree of difficulty. Accordingly, Gallager has proposed an algorithm A or an algorithm B as an algorithm for decoding LDPC codes.

In general, decoding of the LDPC codes is performed in accordance with the procedure shown in FIG. 2. Here, the receiving value (the receiving code sequence) is denoted as $U_0(u_{0i})$, the message output from the check node is denoted as $u_j$, and the message output from the variable node is denoted as $v_i$. Here, the message is a real-number value such that the "0"-likeness of the value is represented by a so-called log likelihood ratio.

In the decoding of the LDPC codes, initially, as shown in FIG. 2, in step S11, the receiving value $U_0(u_{0i})$ is received, the message $u_j$ is initialized to 0, and a variable k that takes an integer as a counter for an iterative process is initialized to 0. The process then proceeds to step S12. In step S12, based on the received value $U_0(u_{0i})$, a message $v_i$ is determined by performing a computation shown in equation (1) (computation of a variable node). Furthermore, based on this message $v_i$, a message $u_j$ is determined by performing a computation shown in equation (2) (computation of a check node).

$$v_i = u_{0i} + \sum_{j=1}^{d_v-1} u_j \tag{1}$$

$$\tanh\left(\frac{u_j}{2}\right) = \prod_{i=1}^{d_c-1} \tanh\left(\frac{v_i}{2}\right) \tag{2}$$

Here, $d_v$ and $d_c$ in equations (1) and (2) are parameters respectively that indicate the number of 1s in the vertical direction (column) and in the horizontal direction (row) of the check matrix H and that can be selected as desired. For example, in the case of a (3, 6) code, $d_v=3$ and $d_c=6$.

In the computation of each of equations (1) and (2), since the message input from an edge (line connecting the variable node and the check node) from which a message is to be output is not used as a parameter for a sum or product computation, the range of the sum or product computation is from 1 to $d_v-1$ or 1 to $d_c-1$. In practice, the computation shown in equation (2) is performed by creating in advance a table of a function $R(v_1, v_2)$, shown in equation (3), that is defined by one output with respect to two inputs $v_1$ and $v_2$ and by using this table continuously (recursively), as shown in equation (4).

$$x = 2\tan h^{-1}\{\tan h(v_1/2)\tan h(v_2/2)\} = R(v_1, v_2) \quad (3)$$

$$u_j = R(v_1, R(v_2, R(v_3, \ldots R(v_{d_c-2}, v_{d_c-1})))) \quad (4)$$

In step S12, furthermore, the variable k is incremented by 1, and the process then proceeds to step S13. In step S13, it is determined whether or not the variable k is greater than a predetermined number N of iterative decodings. When it is determined in step S13 that the variable k is not greater than N, the process returns to step S12, where the identical processing is performed again.

When it is determined in step S13 that the variable k is greater than N, the process proceeds to step S14, where the message $v_i$ serving as the decoded result, which is finally output as a result of performing the computation shown in equation (5), is determined and output. This completes the decoding process of the LDPC codes.

$$v_i = u_{0i} + \sum_{j=1}^{d_v} u_j \quad (5)$$

Here, unlike the computation of equation (1), the computation of equation (5) is performed using the input messages from all the edges connected to the variable nodes.

In such LDPC code decoding, for example, in the case of (3, 6) code, as shown in FIG. 3, messages are exchanged between nodes. In the node (variable node) indicated by "=" in FIG. 3, the computation shown in equation (1) is performed. In the node indicated by "+" (check node), the computation shown in equation (2) is performed. In particular, in the algorithm A, the message is formed to be two-dimensional; in the node indicated by "1+", an exclusive OR computation of $d_c-1$ input messages is performed; and in the node indicated by "=", with respect to the received value R, when all the $d_v-1$ input messages are different bit values, the sign is inverted and output.

Furthermore, in recent years, research on an implementation method of the decoding of LDPC codes has been carried out. Before describing the implementation method, the decoding of LDPC codes is described in a schematic form.

FIG. 4 shows an example of a parity check matrix of (3,6) LDPC codes (a coding rate of ½, a code length of 12). The parity check matrix of LDPC codes can be written by using a Tanner graph, as shown in FIG. 5. In FIG. 5, nodes indicated by "+" are check nodes, and nodes indicated by "=" are variable nodes. The check nodes and the variable nodes correspond to the rows and the columns of the parity check matrix, respectively. The connecting line between the check node and the variable node is an edge and corresponds to "1" of the check matrix. That is, when the element of the j-th row and the i-th column of the check matrix is 1, in FIG. 5, the i-th variable node (node of "=") from the top and the j-th check node (node of "+") from the top are connected to each other by an edge. The edge indicates that the sign bit corresponding to the variable node has a constraint condition corresponding to the check node. FIG. 5 shows a Tanner graph of the check matrix of FIG. 4.

In the sum product algorithm, which is a method of decoding LDPC codes, the computation of the variable node and the computation of the check node are repeatedly performed.

In the variable node, as shown in FIG. 6, the computation of equation (1) (variable node computation) is performed. That is, in FIG. 6, the message $v_i$ corresponding to the edge to be calculated is calculated by using the messages $u_1$ and $u_2$ from the remaining edges connected to the variable node, and the received information $u_{0i}$. The messages corresponding to the other edges are also calculated similarly.

Next, before describing the check node computation, equation (2) is rewritten as shown in equation (6) by using the equation $a \times b = \exp\{\ln(|a|) + \ln(|b|)\} \times \text{sign}(a) \times \text{sign}(b)$, where $\text{sign}(x)$ is 1 when $x \geq 0$ and is $-1$ when $x<0$.

$$
\begin{aligned}
u_j &= 2\tanh^{-1}\left(\prod_{i=1}^{d_c-1} \tanh\left(\frac{v_i}{2}\right)\right) \\
&= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right] \\
&= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]
\end{aligned} \quad (6)
$$

Furthermore, in the case of $x \geq 0$, when the definition $\phi(x) = \ln(\tanh(x/2))$ is made, since $\phi^{-1}(x) = 2\tanh^{-1}(e^{-x})$, equation (6) can be written as equation (7).

$$u_j = \phi^{-1}\left(\sum_{i=1}^{d_c-1} \phi(|v_i|)\right) \times \prod_{i=1}^{d_c-1} \text{sign}(v_i) \quad (7)$$

In the check node, as shown in FIG. 7, the computation of equation (7) (check node computation) is performed. That is, in FIG. 7, the message $u_j$ corresponding to the edge for which a calculation is to be performed is calculated by using the messages $v_1, v_2, v_3, v_4$, and $v_5$ from the remaining edges connected to the check node. The messages corresponding to the other edges are also calculated similarly.

The function $\phi(x)$ can also be expressed as $\phi(x) = \ln((e^x+1)/(e^x-1))$, and when $x>0$, $\phi(x) = \phi^{-1}(x)$. When the functions $\phi(x)$ and $\phi^{-1}(x)$ are implemented as hardware, there are cases in which they are implemented using an LUT (Look-Up Table), and both of them are the same LUT.

When the sum product algorithm is implemented as hardware, it is necessary to repeatedly perform the variable node computation expressed by equation (1) and the check node computation expressed by equation (7) with an appropriate circuit scale and at an appropriate operating frequency.

As an example of the implementation of the decoding apparatus, a description is given first of an implementation method in a case where decoding is performed by simply performing the computation of each node one-by-one in sequence (full serial decoding).

It is assumed here that, for example, codes (a coding rate of 2/3, and a code length of 90) represented by a 30 (rows)×90 (columns) check matrix of FIG. 8 are decoded. The number of 1s of the check matrix of FIG. 8 is 269; therefore, in the Tanner graph, the number of edges becomes 269. Here, in the check matrix of FIG. 8 (the same applies to FIGS. 15 to 17 (to be described later)), 0 is represented by ".".

FIG. 9 shows an example of the configuration of a decoding apparatus for decoding LDPC codes once.

In the decoding apparatus of FIG. 9, a message corresponding to one edge is calculated for each clock at which it operates.

More specifically, the decoding apparatus of FIG. 9 includes one memory 104 for reception, two memories 100 and 102 for edges, one check node calculator 101, and one variable node calculator 103.

In the decoding apparatus of FIG. 9, message data is read one-by-one from the memory 100 or 102 for edges, and by using the message data, the message data corresponding to the desired edge is calculated. Then, the message data determined by that calculation is stored one-by-one in the memory 100 or 102 for edges at a subsequent stage. When iterative decoding is to be performed, the iterative decoding is realized by serially concatenating a plurality of the decoding apparatuses of FIG. 9 for decoding LDPC codes once or by repeatedly using the decoding apparatus of FIG. 9. Here, it is assumed that, for example, a plurality of the decoding apparatuses of FIG. 9 are connected.

The memory 100 for edges stores output messages D100 supplied from the variable node calculator 103 of the decoding apparatus (not shown) at a previous stage in the order in which the check node calculator 101 at a subsequent stage reads them. Then, at the phase of the check node calculation, the memory 100 for edges supplies, to the check node calculator 101, the messages D100 as a message output D101 in the order in which they are stored. By using the message D101 supplied from the memory 100 for edges, the check node calculator 101 performs a computation in accordance with equation (7) and supplies a message D102 determined by that computation to the memory 102 for edges at a subsequent stage.

FIG. 10 shows an example of the configuration of the check node calculator 101 of FIG. 9 for performing check node calculations one-by-one.

In the check node calculator 101 of FIG. 10, messages $v_i$ from the variable node corresponding to each column of the check matrix, which are supplied from the memory 100 for edges, are read one-by-one, and the computation of $\phi(|v_i|)$ in equation (7) is performed using an LUT. Furthermore, $\phi(|v_i|)$ determined from the message $v_i$ from the variable node corresponding to each column over one row of the check matrix is integrated. As a result, the integrated value of $\phi(|v_i|)$ determined from the messages $v_i$ from all the edges is determined. Thereafter, $\phi(|v_i|)$ which was determined from the edge for which the message $u_j$ was desired to be determined and which was delayed at the FIFO (FIFO memory) is subtracted from the integrated value. As a result, for the edge for which the message $u_j$ is desired to be determined, $\Sigma\phi(|v_i|)$ in equation (7) is determined. That is, by subtracting the message from the edge for which the message $u_j$ is desired to be determined from the sum of the messages from all the edges to the check node, the message to the edge for which the message $u_j$ is desired to be determined is determined. Furthermore, based on the LUT, the computation of $\phi^{-1}(\Sigma\phi(|v_i|))$ in equation (7) is performed.

At the same time, the sign bit of the message $u_j$, that is, $\Pi \text{sign}(v_i)$ in equation (7), is also calculated similarly by using an EXOR circuit. In the manner described above, the computation of equation (7) is performed, and the message $u_j$ is determined.

In FIG. 10, the check node calculator 101 is shown by assuming that each message, together with the sign bit, is quantized into a total of 6 bits. Since the maximum row weight of the check matrix to be processed here in FIG. 8 is 9, that is, since the maximum number of messages supplied to the check node is 9, the check node calculator 101 has FIFOs (First In First Out) for delaying nine messages ($\phi(|v_i|)$).

Referring back to FIG. 9, the memory 10 for edges stores the messages D102 supplied from the check node calculator 101 at a previous stage in the order in which the variable node calculator 103 at a subsequent stage reads them. Then, at the phase of the variable node calculation, the memory 10 for edges supplies the message output D102 as a message output D103 to the variable node calculator 103 in the order in which they are stored.

The variable node calculator 103 performs a computation in accordance with equation (1) by using the message output D103 supplied from the memory 10 for edges and received data (received value of the LDPC code) D104 supplied from the memory 104 for reception, and supplies a message D105 obtained as a result of the computation to the memory 100 for edges of the decoding apparatus (not shown) at a subsequent stage.

FIG. 11 shows an example of the configuration of the variable node calculator 103 of FIG. 9 for performing variable node calculations one-by-one.

In the variable node calculator 103 of FIG. 11, messages $u_j$ from the check node corresponding to each row of the check matrix, which are supplied from the memory 102 for edges, are read one-by-one, and the messages from the check node corresponding to each row over one column of the check matrix are integrated to determine the integrated value. Thereafter, the message which was supplied from the edge for which the message $v_i$ is desired to be determined and which was delayed at the FIFO is subtracted from the integrated value. Furthermore, by adding the received value $u_{0i}$, the computation of equation (1) is performed on the basis of the subtracted value obtained thereby. As a result, the message $v_i$ is determined. That is, by subtracting the message from the edge for which the message $v_i$ is desired to be determined from the sum of the messages from all the edges to the variable node, the message to the edge for which the message $v_i$ is desired to be determined is determined.

Also, in FIG. 11, similarly to the case in FIG. 10, the variable node calculator 103 is shown by assuming that each message, together with the sign bit, is quantized into a total of six bits. Furthermore, in the check matrix to be processed here in FIG. 8, since the maximum value of the column weight is 5, the variable node calculator 103 has five FIFOs for delaying a message. When a message of the column whose weight is less than 5 is calculated, the amount of delay at the FIFO is reduced to the value of the weight of the column.

Referring back to FIG. 9 again, a control signal (not shown) is supplied to the decoding apparatus in accordance with the weight of the check matrix. According to the decoding apparatus of FIG. 9, if only the capacities of the memories for edges 100 and 102 and the FIFOs of the check node calculator 101 and the variable node calculator 103 are sufficient, various codes can be decoded by changing only the control signal.

Although not shown, in the decoding apparatus of FIG. 9, at the final stage of the decoding, instead of the variable node calculation of equation (1), the computation of equation (5) is performed, and the computation result is output as the final decoded result.

When LDPC codes are decoded by repeatedly using the decoding apparatus of FIG. 9, the check node computation and the variable node computation are alternately performed. Therefore, for one decoding using the check matrix having 269 edges, of FIG. 8, 269×2=538 clocks are required. Therefore, for example, in order to perform 50 iterative decodings, 538×50=26900 clock operations are necessary while 90 pieces of code information (received values), which is the code length, are received, and thus, a high-speed operation approximately 300 ($\cong$26900/90) times as high as the receiving frequency becomes necessary. In this case, if the receiving frequency is assumed to be several tens of MHz, operation at a speed of GHz or higher is required, and the implementation is not easy.

Furthermore, in a case where, for example, 50 decoding apparatuses of FIG. 9 are concatenated to decode LDPC codes, a plurality of variable node calculations and check node calculations can be performed simultaneously. For example, while the first frame is performing a variable node computation, the second frame performs a check node computation and the third frame performs a variable node computation at a previous stage. In this case, while 90 pieces of code information are received, 269 edges need to be calculated, the decoding apparatus needs to operate at a frequency approximately 3 ($\cong$269/90) times as high as the receiving frequency, and thus realization is sufficiently possible. However, in this case, the circuit scale becomes, in simple terms, 50 times as large as the decoding apparatus of FIG. 9.

Next, a description is given of the implementation method of the decoding apparatus in a case where decoding is performed by simultaneously performing computations of all the nodes (full parallel decoding).

This implementation method is described in, for example, C. Howland and A. Blanksby, "Parallel Decoding Architectures for Low Density Parity Check Codes", Symposium on Circuits and Systems, 2001.

FIGS. 12A to 12C show the configuration of examples of the decoding apparatus for decoding the code (a coding rate of 2/3, and a code length of 90) represented by the check matrix of FIG. 8. FIG. 12A shows the overall configuration of the decoding apparatus. FIG. 12B shows the detailed configuration of the upper portion in the figure surrounded by the dotted line B, of the decoding apparatus of FIG. 12A. FIG. 12C shows the detailed configuration of the lower portion in the figure surrounded by the dotted line C, of the decoding apparatus of FIG. 12A.

The decoding apparatus of FIGS. 12A to 12C includes one memory 205 for reception, two edge interchange devices 200 and 203, two memories 202 and 206 for edges, a check node calculator 201 made up of 30 check node calculators $201_1$ to $201_{30}$, and a variable node calculator 204 made up of 90 variable node calculator $204_1$ to $204_{90}$.

In the decoding apparatus of FIGS. 12A to 12C, all the message data corresponding to 269 edges is read simultaneously from the memory 202 or 206 for edges, and by using the message data, new message data corresponding to the 269 edges is computed. Then, all the new message data determined as a result of the computation is simultaneously stored in the memory 206 or 202 for edges at a subsequent stage. By repeatedly using the decoding apparatus of FIGS. 12A to 12C, iterative decoding is realized. Each section will now be described below in detail.

The memory 206 for edges simultaneously stores all the output messages $D206_1$ to $D206_{90}$ from the variable node calculators $204_1$ to $204_{90}$ at a previous stage, reads the messages $D206_1$ to $D206_{90}$ as messages $D207_1$ to $D207_{90}$ at the next clock (the timing of the next clock), and supplies them as messages D200 ($D200_1$ to $D200_{90}$) to the edge interchange device 200 at the subsequent stage. The edge interchange device 200 rearranges (interchanges) the order of the messages $D200_1$ to $D200_{90}$ supplied from the memory 206 for edges in accordance with the check matrix of FIG. 8, and supplies necessary messages $D201_1$ to $D201_{30}$ to the check node calculators $201_1$ to $201_{30}$, respectively.

The check node calculators $201_1$ to $201_{30}$ perform a computation in accordance with equation (7) by using the messages $D201_1$ to $D201_{30}$ supplied from the edge interchange device 200, and supplies the messages $D202_1$ to $D202_{30}$ obtained as a result of the computation to the memory 202 for edges.

FIG. 13 shows an example of the configuration of a check node calculator $201_m$ (m=1, 2, . . . , 30) of FIGS. 12A to 12C for simultaneously performing check node calculations.

In the check node calculator $201_m$ of FIG. 13, similarly to the check node calculator 101 of FIG. 10, the check node computation of equation (7) is performed, and the check node calculations are simultaneously performed for all the edges.

More specifically, in the check node calculator $201_m$ of FIG. 13, all the messages from the variable node corresponding to each column of the check matrix of FIG. 8, which are supplied from the edge interchange device 200, are read simultaneously, and the computation of $\phi(|v_i|)$ in equation (7) is performed using the LUT. Furthermore, $\phi(|v_i|)$ determined from the message $v_i$ from the variable node corresponding to each column over one row of the check matrix is integrated. This enables the integrated value of $\phi(|v_i|)$ determined from the message $v_i$ from all the edges to be determined. Thereafter, $\phi(|v_i|)$ determined from the edge for which the message $u_j$ is desired to be determined is subtracted from the integrated value. As a result, for the edge for which the message $u_j$ is desired to be determined, $\Sigma\phi(|v_i|)$ in equation (7) is determined. That is, by subtracting the message from the edge for which the message $u_j$ is desired to be determined from the sum of the messages from all the edges to the check node, the message to the edge for which the message $u_j$ is desired to be determined is determined. Furthermore, using the LUT, the computation of $\phi^{-1}(\Sigma\phi(|v_i|))$ in equation (7) is performed. At the same time, the sign bit of the message $u_j$, that is, $\Pi sign(v_i)$ in equation (7), is also calculated similarly by using an EXOR circuit. In the manner described above, the computation of equation (7) is performed, and the message $u_j$ is determined.

In FIG. 13, by assuming that each message, together with the sign bit, is quantized to a total of 6 bits, the check node calculator $201_m$ is shown. The circuit of FIG. 13 corresponds to one check node. For the check matrix to be processed here in FIG. 8, since check nodes of 30 rows, which is the number of the rows thereof, exist, the decoding apparatus of FIGS. 12A to 12C has 30 check node calculators $201_m$ shown in FIG. 13.

In the check node calculator $201_m$ of FIG. 13, nine messages can be calculated simultaneously. For the row weight of the check matrix to be processed here in FIG. 8, the weight of the first row is 8 and the weight of the second row is 9, that is, there is one case in which the number of messages supplied to the check node is 8 and there are nine cases in which the number of messages is 9. Therefore, the check node calculator $201_1$ has a circuit configuration capable of simultaneously calculating eight messages similarly to the circuit of FIG. 13, and the check node calculators $201_2$ to $201_{30}$ are configured the same as the circuit of FIG. 13.

Referring back to FIGS. 12A to 12C, the memory 202 for edges simultaneously stores all the output messages $D202_1$ to $D202_{30}$ supplied from the check node calculators $201_1$ to $201_{30}$ at the previous stage, and at the next time, supplies all the messages $D202_1$ to $D202_{30}$, as the output messages $D203_1$ to $D203_{30}$, to the edge interchange device 203 at the subsequent stage.

The edge interchange device 203 rearranges the order of the messages $D203_1$ to $D203_{30}$ supplied from the memory 202 for edges in accordance with the check matrix of FIG. 8, and supplies necessary messages $D204_1$ to $D204_{90}$ to the variable node calculators $204_1$ to $204_{90}$, respectively.

The variable node calculators $204_1$ to $204_{90}$ perform a computation in accordance with equation (1) by using the messages $D204_1$ to $D204_{90}$ supplied from the edge interchange device 203 and the received data (received values) $D205_1$ to $D205_{90}$ supplied from the memory 205 for reception, and supplies messages $D206_1$ to $D206_{90}$ obtained as a result of the computation to the memory 206 for edges at the subsequent stage.

FIG. 14 shows an example of the configuration of a variable node calculator $204_p$ (p=1, 2, ..., 90) of FIGS. 12A to 12C for simultaneously performing variable node calculations.

In the variable node calculators $204_p$ of FIG. 14, similarly to the variable node calculator 103 of FIG. 11, the check node calculation of equation (7) is performed, and the check node calculations are simultaneously performed for all the edges.

More specifically, in the variable node calculators $204_p$ of FIG. 14, all the messages $u_j$ from the check node corresponding to each row of the check matrix, which are supplied from the edge interchange device 203, are read simultaneously, the message from the check node corresponding to each row over one row of the check matrix is integrated, and the integrated value is determined. Thereafter, the computation of equation (1) is performed by subtracting the message supplied from the edge for which the message $v_i$ is desired to be determined from the integrated value and by adding the received value $u_{0i}$ to the subtracted value obtained thereby. As a result, the message $v_i$ is determined. That is, by subtracting the message for which the message $v_i$ is desired to be determined from the sum of the messages from all the edges to the variable node, the message to the edge for which the message $v_i$ is desired to be determined is determined.

In FIG. 14, by assuming that each message, together with the sign bit, is quantized to six bits, the variable node calculators $204_p$ is shown. The circuit of FIG. 14 corresponds to one variable node. For the check matrix to be processed here in FIG. 8, since variable nodes of 90 columns, which is the number of the columns thereof, exist, the decoding apparatus of FIGS. 12A to 12C has 90 variable node calculators $204_p$ shown in FIG. 14.

In the variable node calculators $204_p$ of FIG. 14, it is possible to simultaneously calculate five messages. The check matrix to be processed here in FIG. 8 have 15, 45, 29, and 1 columns having weights of 5, 3, 2, and 1, respectively. Therefore, 15 variable node calculators out of the variable node calculators $204_1$ to $204_{90}$ have the same circuit configuration as that of the circuit of FIG. 14. The remaining 45, 29, and 1 variable node calculators have the circuit configuration capable of simultaneously calculating 3, 2, and 1 messages similarly to the circuit of FIG. 14.

Although not shown, also, in the decoding apparatus of FIGS. 12A to 12C, similarly to the case of FIG. 9, at the final stage of the decoding, instead of the variable node calculation of equation (1), the computation of equation (5) is performed, and the computation result is output as the decoded result.

According to the decoding apparatus of FIGS. 12A to 12C, it is possible to simultaneously calculate all the messages corresponding to 269 edges at one clock.

When decoding is performed by repeatedly using the decoding apparatus of FIGS. 12A to 12C, the check node computation and the variable node computation are alternately performed, and one decoding can be performed at two clocks. Therefore, for example, in order to perform 50 decodings, while 90 pieces of code information are received, the decoding apparatus needs to operate at 2×50=100 clocks, and thus, approximately the same operating frequency as the receiving frequency may be used. In general, since the code length of the LDPC codes is as great as several thousands to several tens of thousands, if the decoding apparatus of FIGS. 12A to 12C is used, the number of decodings can be greatly increased, and the improvement in the error correction performance can be expected.

However, in the decoding apparatus of FIGS. 12A to 12C, since computations of messages corresponding to all the edges of a Tanner graph are performed in parallel, the circuit scale increases in proportion to the code length. When the decoding apparatus of FIGS. 12A to 12C is configured as an apparatus for performing the decoding of LDPC codes having a particular check matrix of a particular code length and a particular coding rate, it is difficult for the decoding apparatus to perform the decoding of LDPC codes having another check matrix of another code length and another coding rate. That is, unlike the decoding apparatus of FIG. 9, it is not possible for the decoding apparatus of FIGS. 12A to 12C to decode various codes even if the control signal is changed only, and the dependence on codes is high.

In addition to the decoding apparatus of FIG. 9 and FIGS. 12A to 12C, the implementation method for simultaneously calculating messages in units of four messages rather than one message or all messages is described in, for example, E. Yeo, P. Pakzad, B. Nikolic and V. Anantharam, "VLSI Architectures for Iterative Decoders in Magnetic Recording Channels", IEEE Transactions on Magnetics, Vol. 37, No. 2, March 2001. In this case, there are problems in that, generally, it is not easy to avoid simultaneous read-out from or simultaneous writing to different addresses of the memory, and memory access control is difficult.

Furthermore, a method of implementation by approximating the sum product algorithm has also been proposed. However, in this method, the deterioration of performance is caused to occur.

FIG. 15 shows an example of a check matrix of LDPC codes of a code length of 90 and a coding rate of ⅔. When the implementation of the decoding apparatus for decoding LDPC codes, represented by this check matrix, is considered, the design itself of the decoding apparatus for calculating messages corresponding to the edge one-by-one or the decoding apparatus for simultaneously calculating all the messages corresponding to the edge is not difficult.

However, the realization of the decoding apparatus is not easy from the aspect of the circuit scale and the operation speed.

When the codes represented by the check matrix of FIG. 15 are decoded by using the decoding apparatus for simultaneously calculating particular p edges, in the memory in which edge data (messages corresponding to the edge) is stored, access of read-out from or access of writing to a position (address) different for each row or column is necessary. Therefore, different FIFOs need to be used for each row or column. Furthermore, for the message, there are cases in which the order in which it is calculated in the check node computation and the order in which it is used in the next variable node computation are interchanged, and thus it is not easy to realize the memory for storing messages simply by an FIFO.

DISCLOSURE OF INVENTION

The present invention has been made in view of such circumstances. An object of the present invention is to suppress the operating frequency to a sufficiently realizable range while suppressing the circuit scale for both logic and memory, and to be capable of easily controlling memory access.

The decoding method of the present invention includes a decoding step of decoding LDPC codes by using a transformation check matrix obtained by performing one of or both a row permutation and a column permutation on an original check matrix.

The decoding apparatus of the present invention includes decoding means for decoding LDPC codes by using a transformation check matrix obtained by performing one of or both a row permutation and a column permutation on an original check matrix.

The program of the present invention includes a decoding step of decoding LDPC codes by using a transformation check matrix obtained by performing one of or both a row permutation and a column permutation on an original check matrix.

In the present invention, LDPC codes are decoded by using a transformation check matrix obtained by performing one of or both a row permutation and a column permutation on an original check matrix.

BRIEF DESCRIPTION OF THE DRAWINGS

Figure 1:
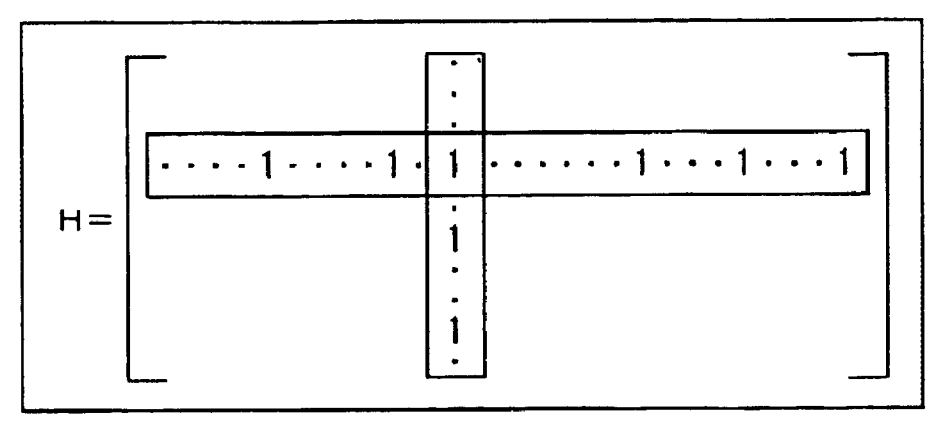

FIG. 1 illustrates a check matrix H of LDPC codes.

FIG. 2 is a flowchart illustrating a procedure for decoding LDPC codes.

FIG. 3 illustrates the flow of messages.

FIG. 4 shows an example of a check matrix of LDPC codes.

FIG. 5 shows a Tanner graph of the check matrix.

FIG. 6 shows a variable node.

FIG. 7 shows a check node.

FIG. 8 shows an example of a check matrix of LDPC codes.

FIG. 17 shows a matrix, which is divided into 5×5 units.

FIG. 18A is a block diagram showing an example of the configuration of an embodiment of a decoding apparatus to which the present invention is applied.

FIG. 19 is a block diagram showing an example of the configuration of an embodiment of a computer to which the present invention is applied.

BEST MODE FOR CARRYING OUT THE INVENTION

Specific embodiments to which the present invention is applied will be described below in detail with reference to the drawings.

Figure 15:
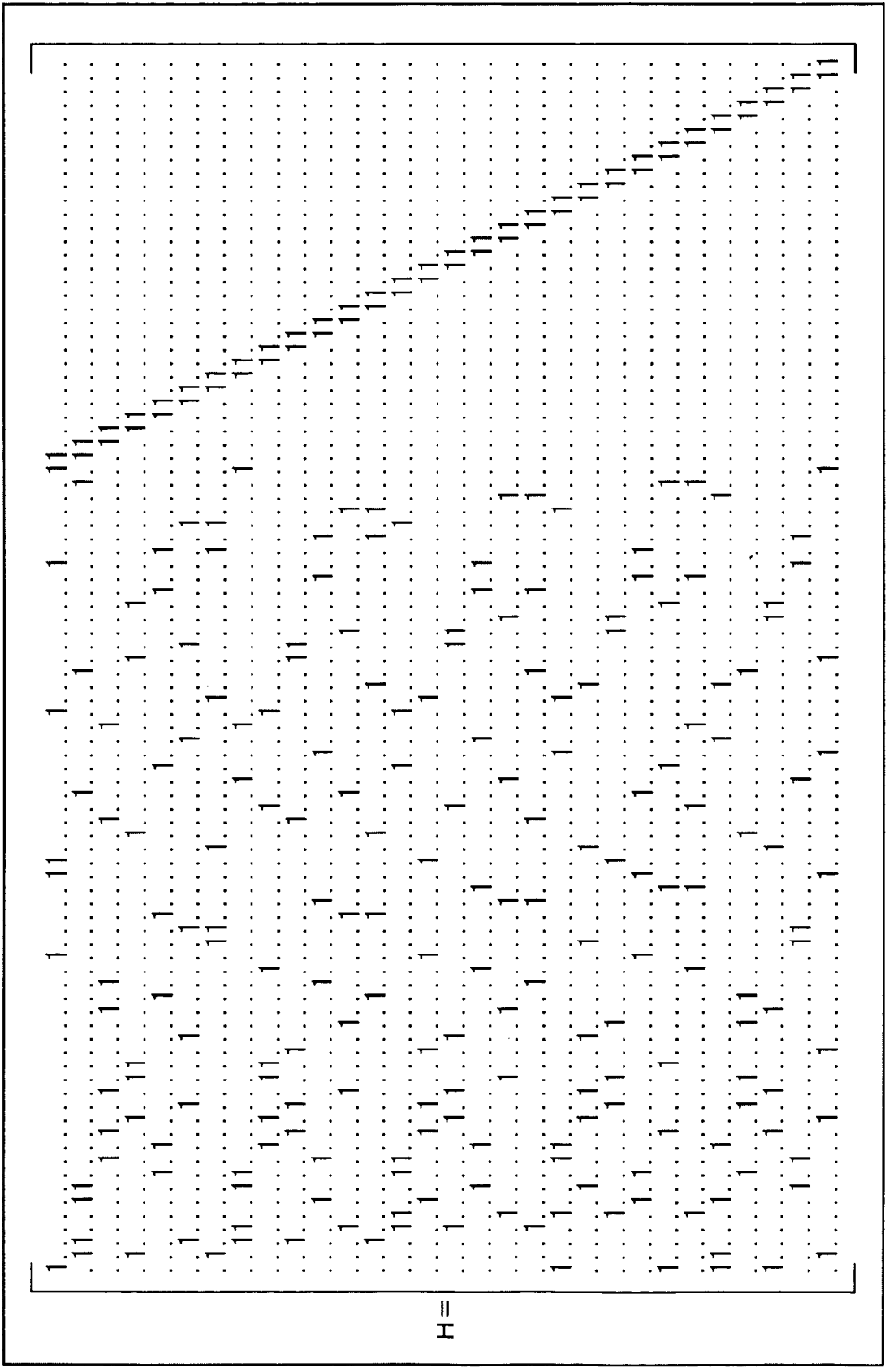
FIG. 15 shows an example of a check matrix of LDPC codes.
Figure 16:
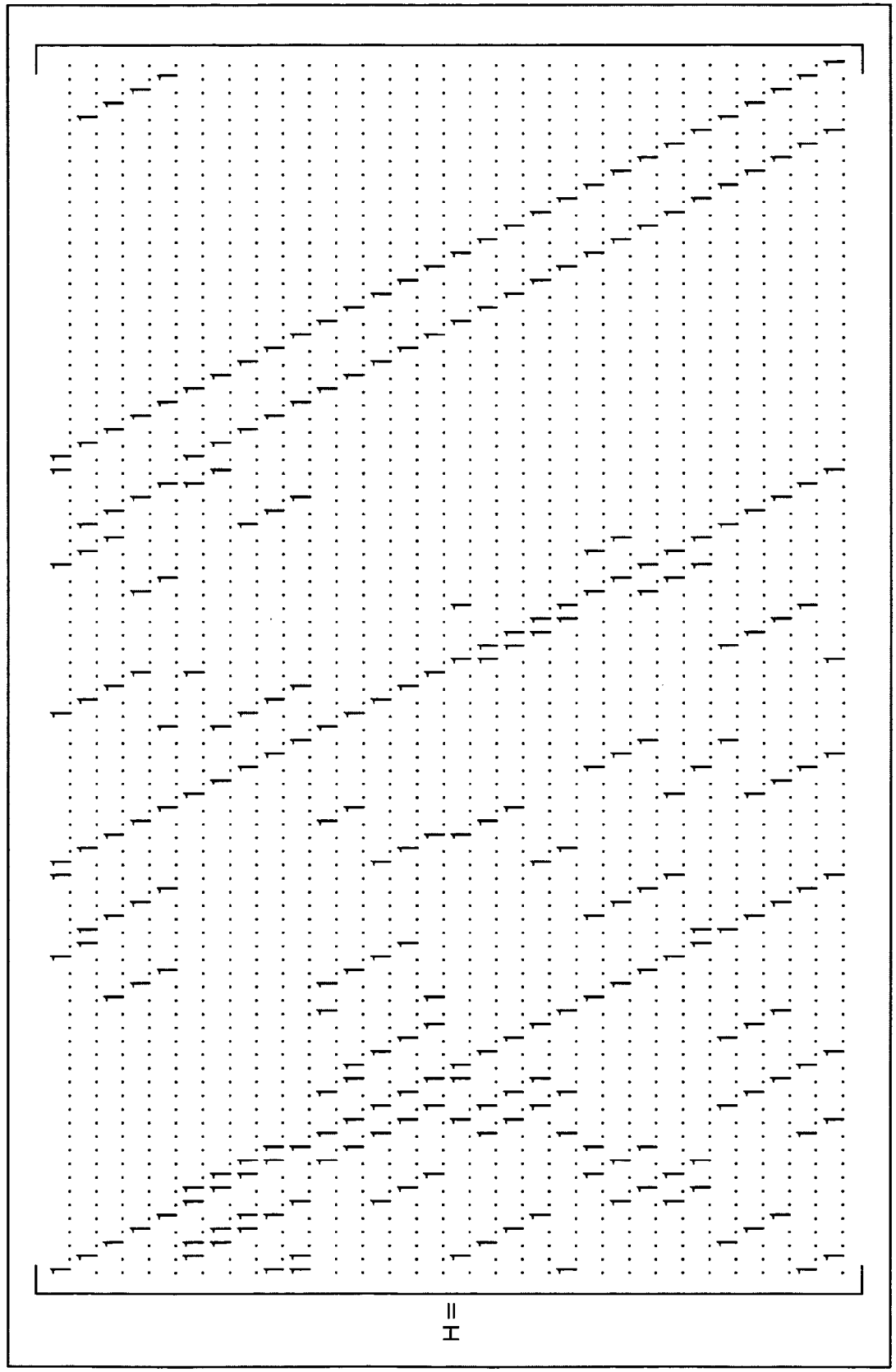
FIG. 16 shows a matrix in which a row permutation and a column permutation are performed on a check matrix.

FIG. 16 shows a matrix in which a row permutation of equation (8) and a column permutation of equation (9) are performed on a check matrix of FIG. 15.

$$\text{Row permutation:} 6x+y+1\text{-th row} \rightarrow 5y+x+1\text{-th row} \quad (8)$$

$$\text{Column permutation:} 6s+t+61\text{-th column} \rightarrow 5t+s+61\text{-th column} \quad (9)$$

In equations (8) and (9), x, y, s, and t are each an integer in the range of $0 \leq x < 5$, $0 \leq y < 6$, $0 \leq s < 5$, and $0 \leq t < 6$.

According to the row permutation of equation (8), a permutation is performed in such a manner that the 1st, 7th, 13th, 19th, and 25th rows which, when divided by 6, give a remainder of 1, is permuted in the 1st, 2nd, 3rd, 4th, and 5th row, and the 2nd, 8th, 14th, 20th, and 26th rows which, when divided by 6, give a remainder of 2, are permuted in the 6th, 7th, 8th, 9th, and 10th rows.

According to the column permutation of equation (9), with respect to the 61st and subsequent columns, a permutation is performed in such a manner that the 61st, 67th, 73rd, 79th, and 85th columns which, when divided by 6, give a remainder of 1, are permuted in the 61st, 62nd, 63rd, 64th, and 65th columns, and the 62nd, 68th, 74th, 80th, and 86th column which, when divided by 6, give a remainder of 2, are permuted in the 66th, 67th, 68th, 69th, and 70th columns.

The matrix obtained by performing row and column permutations on the check matrix of FIG. 15 in this manner is the check matrix of FIG. 16.

It is self-explanatory that a 0 vector is output when the check matrix of FIG. 16 (hereinafter referred to as a "permutation check matrix" where appropriate) is multiplied by that on which the same permutation as equation (9) is performed on the sequence of codewords of codes (original codes with no errors) represented by the check matrix of FIG. 15 (hereinafter referred to as an "original check matrix" as appropriate). That is, if the original check matrix is denoted as a matrix H, the permutation check matrix is denoted as a matrix H', the sequence of the codewords of the original codes is denoted as a row vector c, and a row vector obtained by performing a column permutation of equation (9) on the row vector c is denoted as c', $Hc^T$ (the superscript T indicates a transpose) becomes a 0 vector from the property of the check matrix. Naturally, $H'c'^T$ also becomes a 0 vector.

Based on the above, the transformation check matrix of FIG. 16 is a check matrix of codes c' in which the sequence c of the codewords of the original codes on which the column permutation of equation (9) is performed are codewords.

Therefore, when data that is coded by the original code is received and decoded, even if the column permutation of equation (9) is performed on the received code sequence, the code sequence after the column permutation is decoded using the decoding apparatus based on the transformation check matrix of FIG. 16, and the inverse permutation of the column permutation of equation (2) is performed on the sequence of the decoded result, there is no difference in the decoded result from the case in which the decoding apparatus based on the original codes is used. As a result, no deterioration of the performance is caused to occur. That is, the decoding apparatus based on the original check matrix of FIG. 15 can be realized by using the decoding apparatus based on the transformation check matrix of FIG. 16.

FIG. 17 shows the transformation check matrix of FIG. 16 in which intervals are provided in units of 5×5 matrices.

In FIG. 17, the check matrix (transformation check matrix) is represented by a combination of a 5×5 unit matrix, a matrix in which one or more is, which are elements of the unit matrix, are substituted with 0 (hereinafter referred to as a "quasi-unit matrix" where appropriate), a matrix in which the unit matrix or the quasi-unit matrix is cyclically shifted (hereinafter referred to as a "shift matrix" where appropriate), a sum of two or more of the unit matrix, the quasi-unit matrix, the shift matrix (hereinafter referred to as a "sum matrix" where appropriate), and a 5×5 0-matrix.

It may be said that the check matrix of FIG. 17 is formed of a 5×5 matrix, a quasi-unit matrix, a shift matrix, a sum matrix, and a 0-matrix. Therefore, these 5×5 matrices, which form the check matrix, will be hereinafter referred to as "formation matrices" where appropriate.

For decoding codes represented by the check matrix represented by such P×P formation matrices, architecture for simultaneously performing p calculations of check nodes and variable nodes can be used.

Figure 18B:
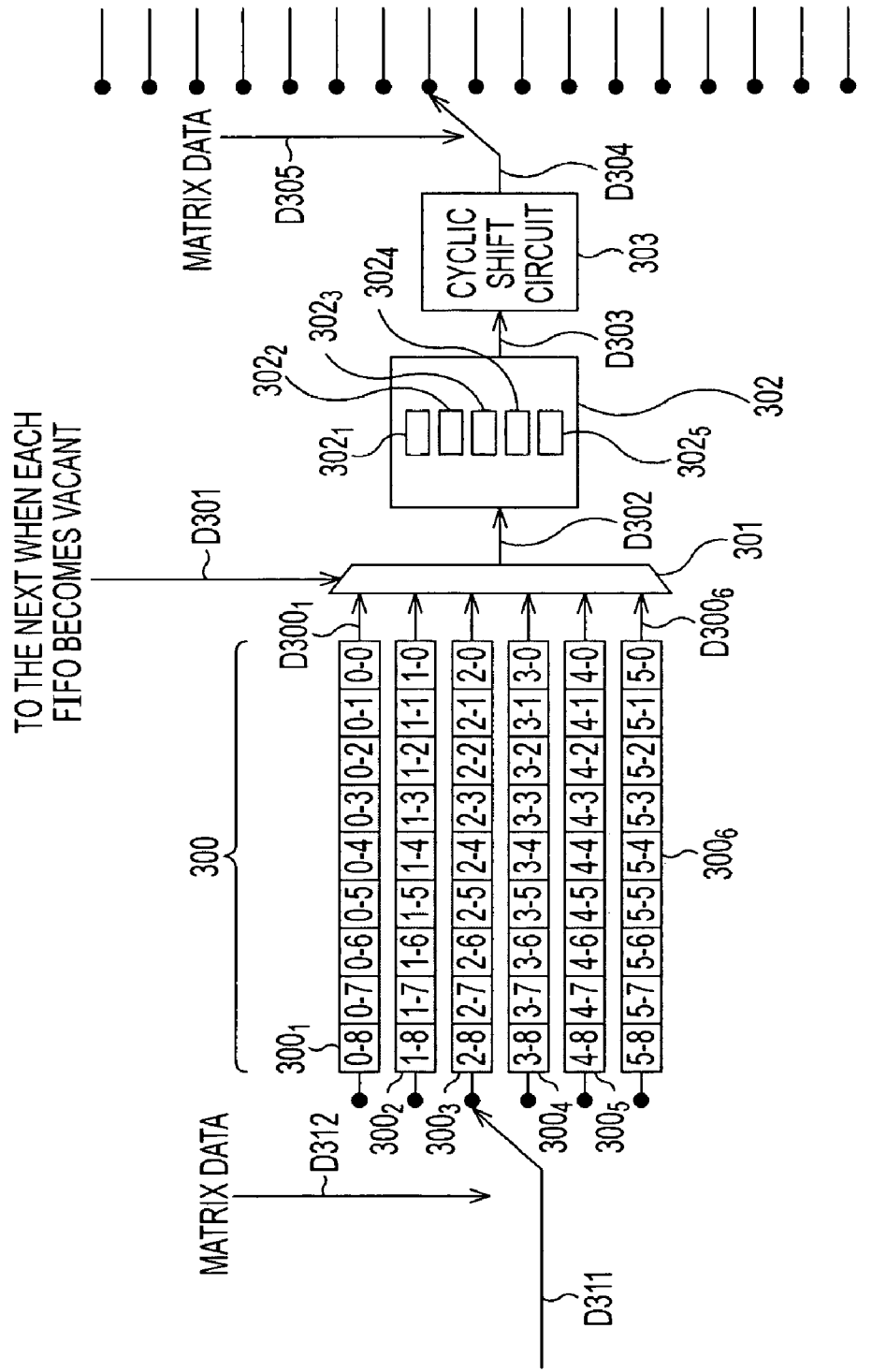
FIG. 18B is a block diagram showing an example of the configuration of the embodiment of the decoding apparatus to which the present invention is applied.
Figure 18C:
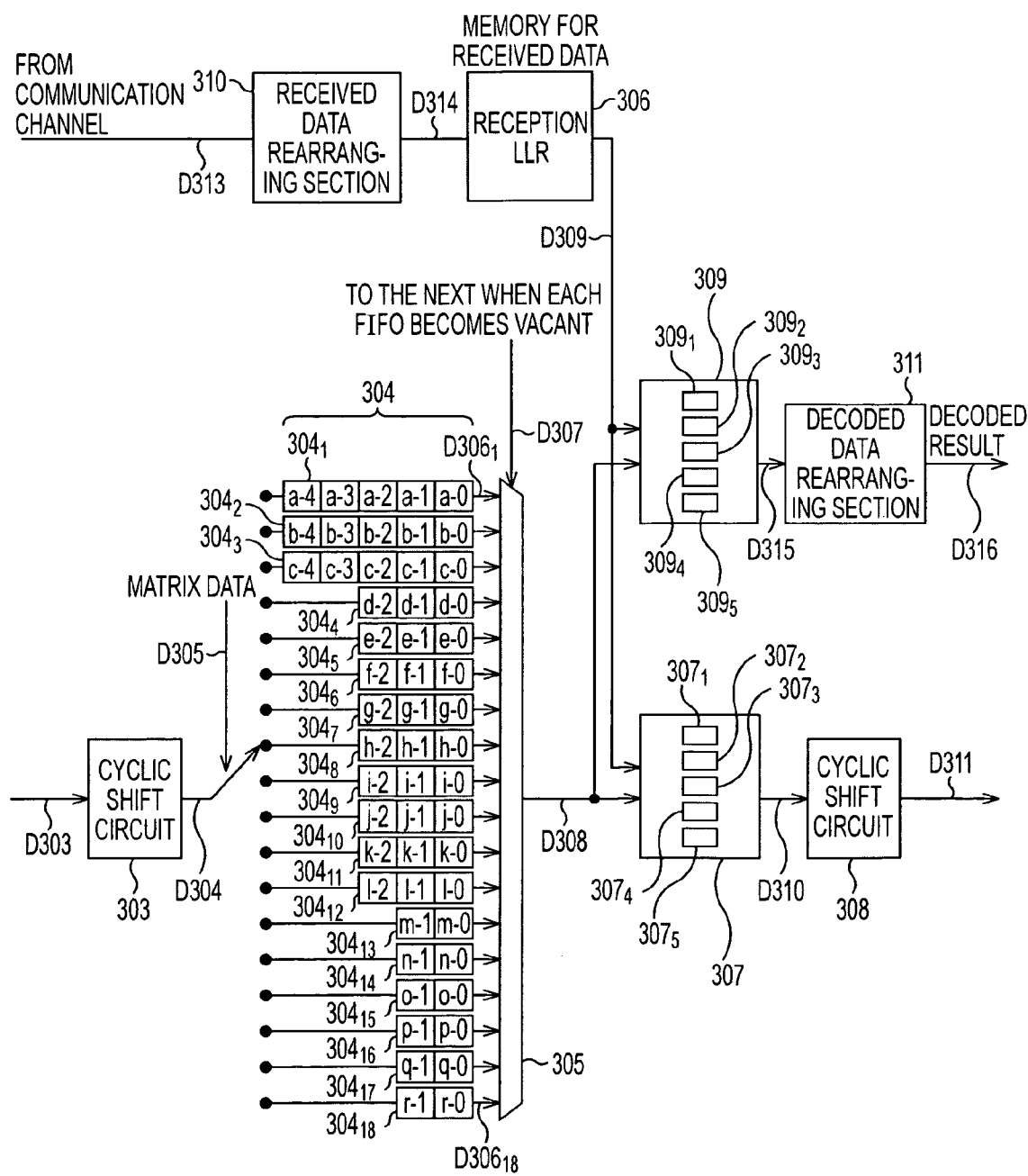
FIG. 18C is a block diagram showing an example of the configuration of the embodiment of the decoding apparatus to which the present invention is applied.

FIGS. 18A to 18C are block diagrams showing an example of the configuration of an embodiment of such a decoding apparatus. That is, FIGS. 18A to 18C show an example of the decoding apparatus for performing decoding of LDPC codes by using a transformation check matrix of FIG. 17, obtained by performing a row or column permutation on the original check matrix of FIG. 15.

FIG. 18A shows the overall configuration of the decoding apparatus. FIG. 18B shows the detailed configuration of the left portion in the figure surrounded by the dotted line B, of the decoding apparatus of FIG. 18A. FIG. 18C shows the detailed configuration of the right portion in the figure surrounded by the dotted line C, of the decoding apparatus of FIG. 18A.

The decoding apparatus includes a memory 300 for storing edge data, which is made up of six FIFOs $300_1$ to $300_6$, a selector 301 for selecting the FIFOs $300_1$ to $300_6$, a check node calculator 302, two cyclic shift circuits 303 and 308, a memory 304 for storing edge data, which is made up of 18 FIFOs $304_1$ to $304_{18}$, a selector 305 for selecting the FIFOs $304_1$ to $304_{18}$, a received data memory 306 for storing received information, a variable node calculator 307, a decoded word calculation section 309, a received data rearranging section 310, and a decoded data rearranging section 311.

Before describing in detail each section of the decoding apparatus, the method of storing data in the memories 300 and 304 for storing edge data will be described first.

The memory 300 for storing edge data includes six FIFOs $300_1$ to $300_6$, the number being such that the number of rows, 30, of the transformation check matrix of FIG. 17 is divided by the number of rows, 5. The FIFO $300_y$ (y=1, 2, . . . , 6) is formed in such a manner that messages corresponding to five edges, which is the number of the rows and columns of the formation matrix, can be read or written simultaneously. The length (the number of stages) thereof is 9, which is the maximum number of the number of 1s (Hamming weight) in the row direction of the transformation check matrix of FIG. 17.

In the FIFO $300_1$, the data corresponding to the positions of 1s from the first row up to the fifth row of the check matrix (transformation check matrix) of FIG. 17 is stored in such a manner that is are padded closer (in a manner in which 0s are ignored) in the horizontal direction for each row. That is, if the j-th row and the i-th column is denoted as (j, i), in the first element (the first stage) of the FIFO $300_1$, data corresponding to the positions of 1s of the 5×5 unit matrix from (1, 1) to (5, 5) of the check matrix is stored. In the second element, the data corresponding to the positions of 1s of the shift matrix (shift matrix in which the 5×5 unit matrix is cyclically shifted by three to the right) from (1, 21) to (5, 25) of the check matrix is stored. Also, in the third to eighth elements, similarly, data is stored in such a manner as to correspond to the check matrix. In the nine element, data corresponding to the positions of 1s of the shift matrix (shift matrix in which 1s of the first row within the 5×5 unit matrix are substituted with 0 and is cyclically shifted by one to the left) from (1, 86) to (5, 90) of the check matrix is stored. Here, in the shift matrix from (1, 86) to (5, 90) of the check matrix, since there are no is in the first row, the number of elements becomes 8 only for the first row of the FIFO $300_1$, and the number of elements becomes 9 for the remaining rows.

In the FIFO $300_2$, the data corresponding to the positions of 1s from the sixth row up to the tenth row of the check matrix of FIG. 17 is stored. That is, in the first element of the FIFO $300_2$, data corresponding to the positions of 1s of the first shift matrix forming the sum matrix from (6, 1) to (10, 5) of the check matrix (the sum matrix which is the sum of the first shift matrix in which the 5×5 unit matrix is cyclically shifted by one to the right and the second shift matrix in which the 5×5 unit matrix is cyclically shifted by two to the right) is stored. In the second element, data corresponding to the positions of 1s of the second shift matrix forming the sum matrix from (6, 1) to (10, 5) of the check matrix is stored.

More specifically, for the formation matrix whose weight is 2 or more, the data (the message corresponding to the edge belonging to the unit matrix, the sum matrix, or the shift matrix) corresponding to the positions of 1s of the unit matrix, the quasi-unit matrix, or the shift matrix, whose weight is 1, when the formation matrix is represented in the form of the sum of two or more of the P×P unit matrix whose weight is 1, a quasi-unit matrix in which one or more is, which are elements of the unit matrix, are substituted with 0, and a shift matrix in which the unit matrix or the quasi-unit matrix is cyclically shifted, is stored at the same address (the same FIFOs among the FIFO $300_1$ to $300_6$).

Hereafter, for the third to the ninth elements, the data is stored in such a manner as to correspond to the check matrix. The number of elements of the FIFO $300_2$ is 9 for all the rows.

For the FIFOs $300_3$ to $300_6$, similarly, data is stored in such a manner as to correspond to the check matrix, and the length of each of the FIFOs $300_3$ to $300_6$ is 9.

The memory 304 for storing edge data is formed of 18 FIFOs $304_1$ to $304_{18}$, the number being such that the number 90 of rows of the check matrix is divided by 5, which is the number of the rows of the formation matrix. The FIFO $304_x$ (x=1, 2, . . . , 18) is formed in such a manner that messages corresponding to five edges, the number being the number of the rows and the number of the columns of the formation matrix, can be read or written simultaneously.

In the FIFO $304_1$, data corresponding to the positions of 1s from the first column up to the fifth column of the check matrix of FIG. 17 is stored in such a manner as to be padded closer in the vertical direction for each column (in a manner in which 0s are ignored). That is, in the first element (the first stage) of the FIFO $304_1$, data corresponding to the positions of 1s of the 5×5 unit matrix from (1, 1) up to (5, 5) of the check matrix is stored. In the second element, data corresponding to the positions of 1s of the first shift matrix forming the sum matrix of (6, 1) to (10, 5) of the check matrix (the sum matrix, which is the sum of the first shift matrix in which the 5×5 unit matrix is cyclically shifted by one to the right and the second shift matrix in which the 5×5 unit matrix is cyclically shifted by two to the right) is stored. In the third element, data corresponding to the positions of 1s of the second shift matrix forming the sum matrix of (6, 1) up to (10, 5) of the check matrix is stored.

More specifically, for the formation matrix whose weight is 2 or more, the data (the message corresponding to the edge belonging to the unit matrix, the quasi-unit matrix, the sum matrix, or the shift matrix) corresponding to the positions of 1s of the unit matrix, the quasi-unit matrix, or the shift matrix, whose weight is 1, when the formation matrix is represented in the form of the sum of two or more of the P×P unit matrix whose weight is 1, a quasi-unit matrix in which one or more is, which are elements of the unit matrix, are substituted with 0, and a shift matrix in which the unit matrix or the quasi-unit matrix is cyclically shifted, is stored at the same address (the same FIFOs among the FIFOs $304_1$ to $304_{18}$).

Hereafter, for the fourth and fifth elements, also, data is stored in such a manner as to correspond to the check matrix. The number of elements (the number of stages) of the FIFO $304_1$ is 5, which is the maximum number of the number of 1s (Hamming weight) in the row direction from the first column up to the fifth column of the check matrix.

Also, for the FIFOs $304_2$ and $304_3$, similarly, data is stored in such a manner as to correspond to the check matrix, and each of the length (the number of stages) thereof is 5. Also, for the FIFOs $304_4$ to $304_{12}$, similarly, data is stored in such a manner as to correspond to the check matrix, and each of the lengths thereof is 3. Also, for the FIFOs $304_{13}$ to $304_{18}$, similarly, data is stored in such a manner as to correspond to the check matrix, and each of the lengths thereof is 2. However, since the first element of the FIFO $304_{18}$ corresponds to (1, 86) up to (5, 90) of the check matrix, and there are no is in the fifth column ((1, 90) up to (5, 90) of the check matrix), data is not stored.

A description will now be given below in detail of the operation of each section of the decoding apparatus of the FIGS. 18A to 18C.

The memory 300 for storing edge data includes six FIFOs $300_1$ to $300_6$. The FIFO for storing data is selected from among the FIFOs $300_1$ to $300_6$ in accordance with the information on which row of the check matrix the five pieces of the message data supplied from the cyclic shift circuit 308 at a previous stage belongs to. In the selected FIFO, the five pieces of the message data D311 are collectively stored in sequence. When data is to be read, the memory 300 for storing edge data sequentially reads five pieces of the message data $D300_1$ from the FIFO $300_1$, and supplies them to the selector 301 at the subsequent stage. After the reading of the message data from the FIFO $300_1$ is completed, the memory 300 for storing edge data reads the message data in sequence also from the FIFOs $300_2$ to $300_6$ and supplies it to the selector 301.

The selector 301 selects five pieces of the message data from the FIFO from which data has been currently read from among the FIFOs $300_1$ to $300_6$ in accordance with the select signal D301, and supplies them as message data D302 to the check node calculator 302.

The check node calculator 302 includes five check node calculators $302_1$ to $302_5$. The check node calculator 302 performs a computation in accordance with equation (7) by using messages D302 ($D302_1$ to $D302_5$) supplied through the selector 301, and supplies the five messages D303 ($D303_1$ to $D303_5$) obtained as a result of the computation to the cyclic shift circuit 303.

Figure 10:
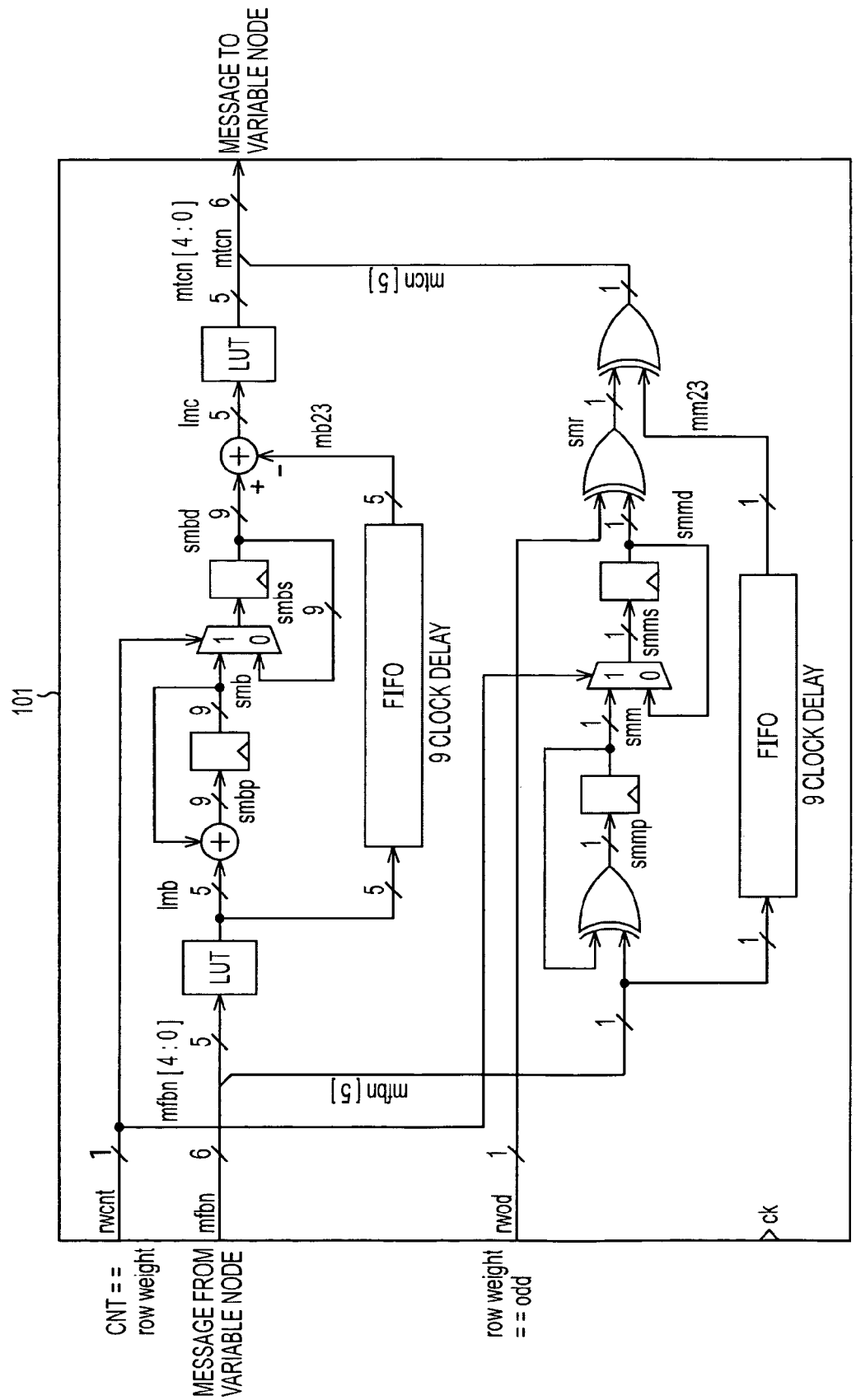
FIG. 10 is a block diagram showing an example of the configuration of a check node calculator for calculating messages one-by-one.

The check node calculators $302_1$ to $302_5$ are each configured the same as the check node calculator 101 shown in FIG. 10.

The cyclic shift circuit 303 cyclically shifts the five messages $D303_1$ to $D303_5$ calculated by the check node calculator 302 on the basis of the information (matrix data) D305 as to how many the unit matrix in which the corresponding edge is the origin in the check matrix is cyclically shifted, and supplies the result as a message D304 to the memory 304 for storing edge data.

The memory 304 for storing edge data includes 18 FIFOs $304_1$ to $304_{18}$. The FIFO for storing data is selected from among the FIFOs $304_1$ to $304_{18}$ in accordance with information D305 as to which row of the check matrix the five pieces of the message data D304 supplied from the cyclic shift circuit 303 at a previous stage belongs to, and the five pieces of the message data D304 is stored collectively in sequence in the selected FIFO. Furthermore, when the data is to be read, the memory 304 for storing edge data sequentially reads five messages $D306_1$ from the FIFO $304_1$ and supplies it to the selector 305 at the subsequent stage. After the reading of the data from the FIFO $304_1$ is completed, the memory 304 for storing edge data sequentially reads the message data from the FIFOs $304_1$ to $304_{18}$ and supplies them to the selector 305.

In accordance with a select signal D307, the selector 305 selects five pieces of the message data from the FIFO from which data has been currently read from among the FIFOs $304_1$ to $304_{18}$, and supplies them as message data D308 to the variable node calculator 307 and the decoded word calculation section 309.

On the other hand, the received data rearranging section 310 rearranges the code sequence (received data) D313 of the LDPC codes, which is received through the communication channel, by performing a column permutation of equation (9), and supplies it as a code sequence D314 to the memory 306 for received data. The memory 306 for received data, which has calculated the reception LLR (log likelihood ratio) from the code sequence D314 supplied from the received data rearranging section 310, supplies five pieces of the calculated reception LLR, as data D309, to the variable node calculator 307 and the decoded word calculation section 309.

The variable node calculator 307 includes five variable node calculators $307_1$ to $307_5$. The variable node calculator 307 performs a computation in accordance with equation (1) by using messages D308 ($D308_1$ to $D308_5$) supplied through the selector 305 and five reception LLR D309 supplied from the memory 306 for received data, and supplies messages D310 ($D310_1$ to $D310_5$) obtained as a result of the computation to the cyclic shift circuit 308.

Figure 11:
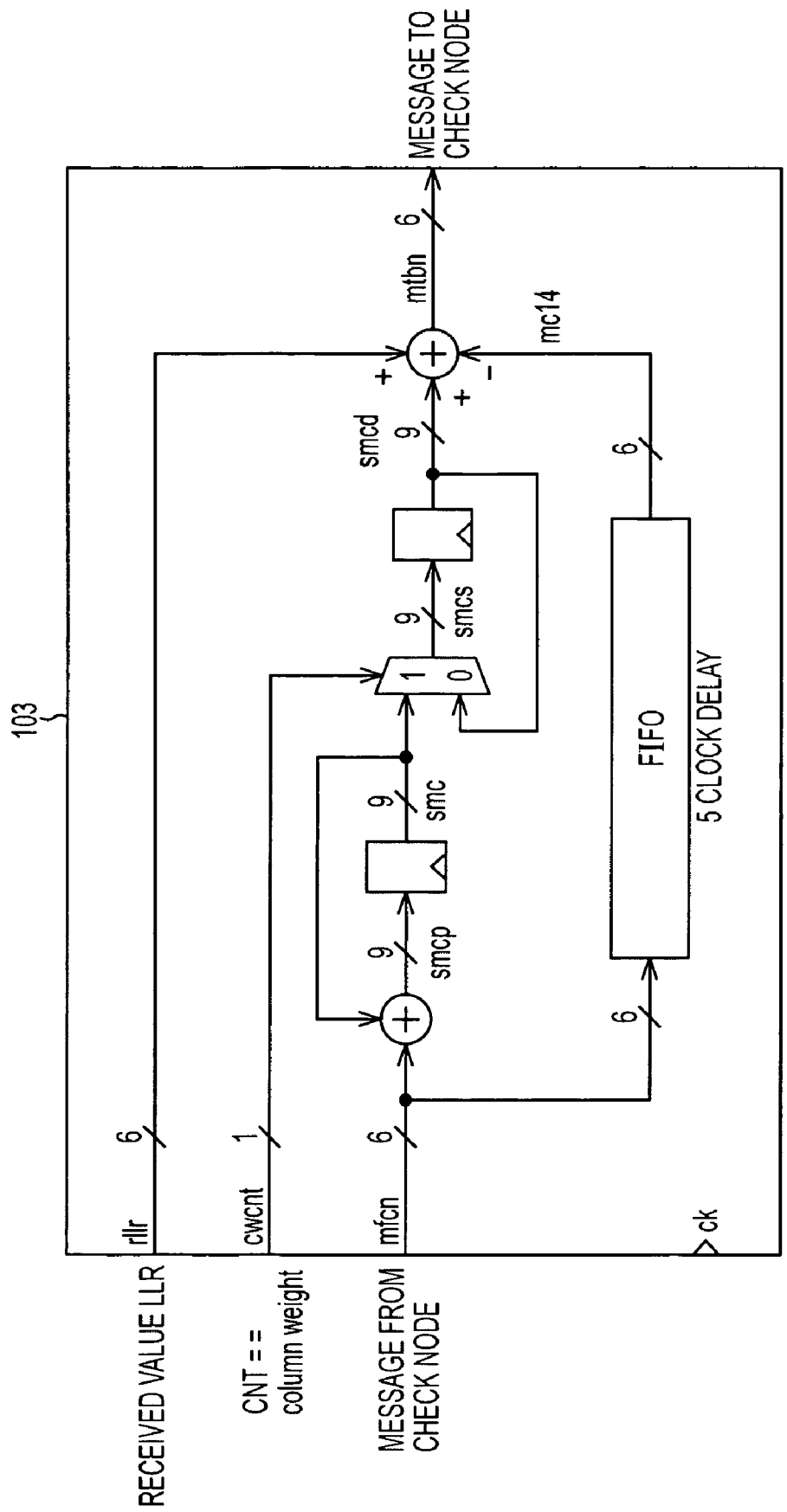
FIG. 11 is a block diagram showing an example of the configuration of a variable node calculator for calculating messages one-by-one.
Figure 12A:
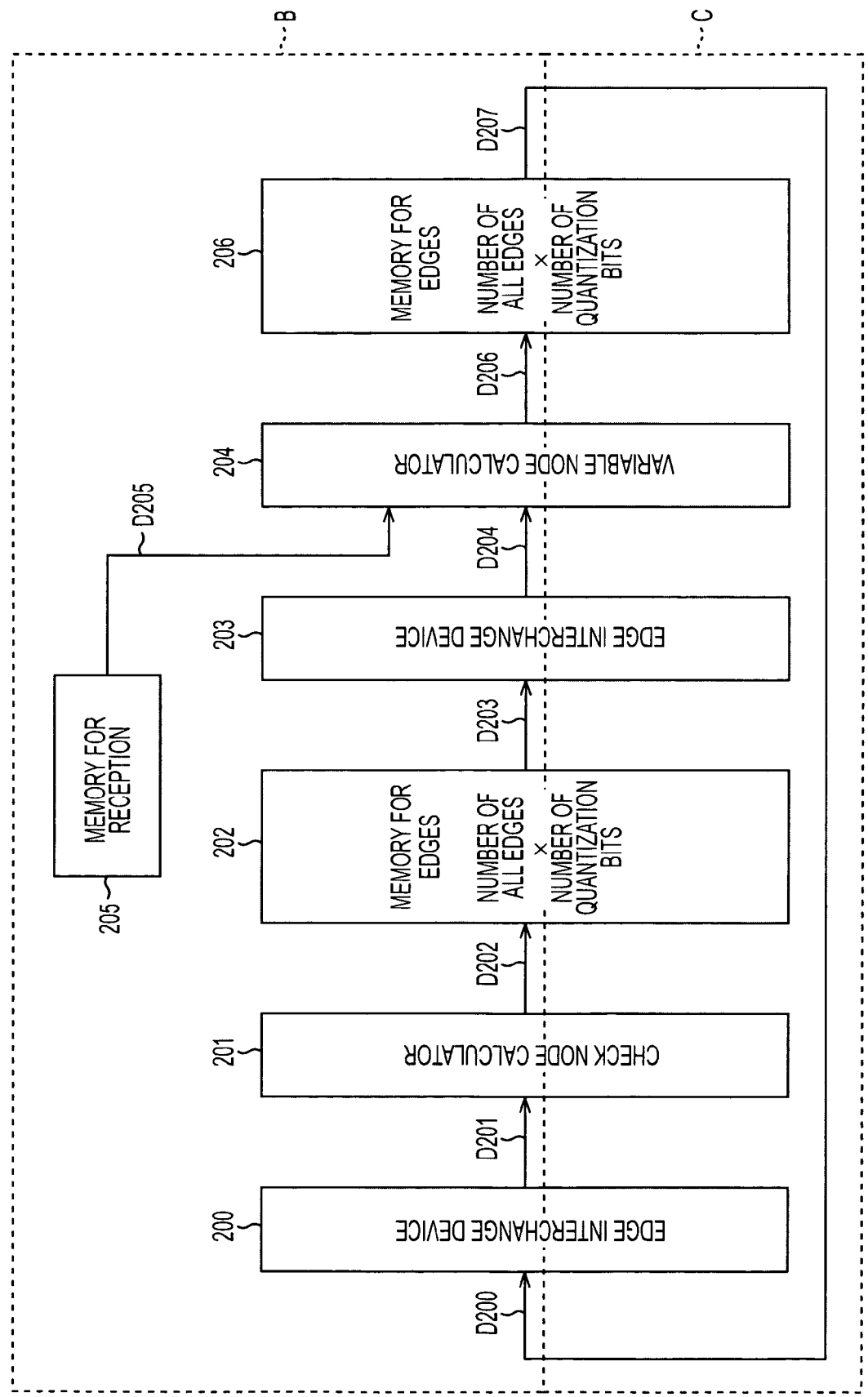
FIG. 12A is a block diagram showing an example of the configuration of an LDPC code decoding apparatus for simultaneously performing all node computations.
Figure 12B:
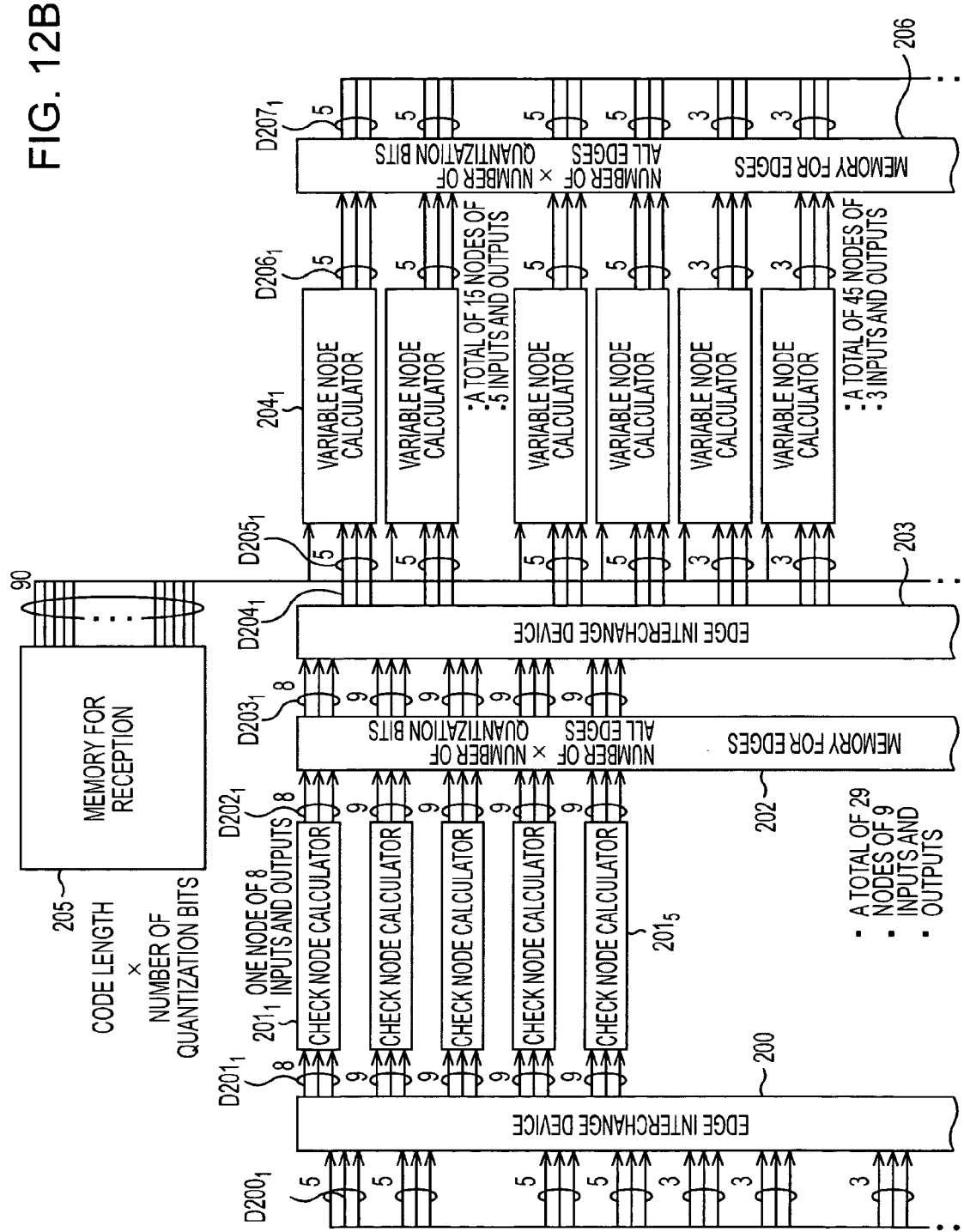
FIG. 12B is a block diagram showing an example of the configuration of the LDPC code decoding apparatus for simultaneously performing all node computations.
Figure 12C:
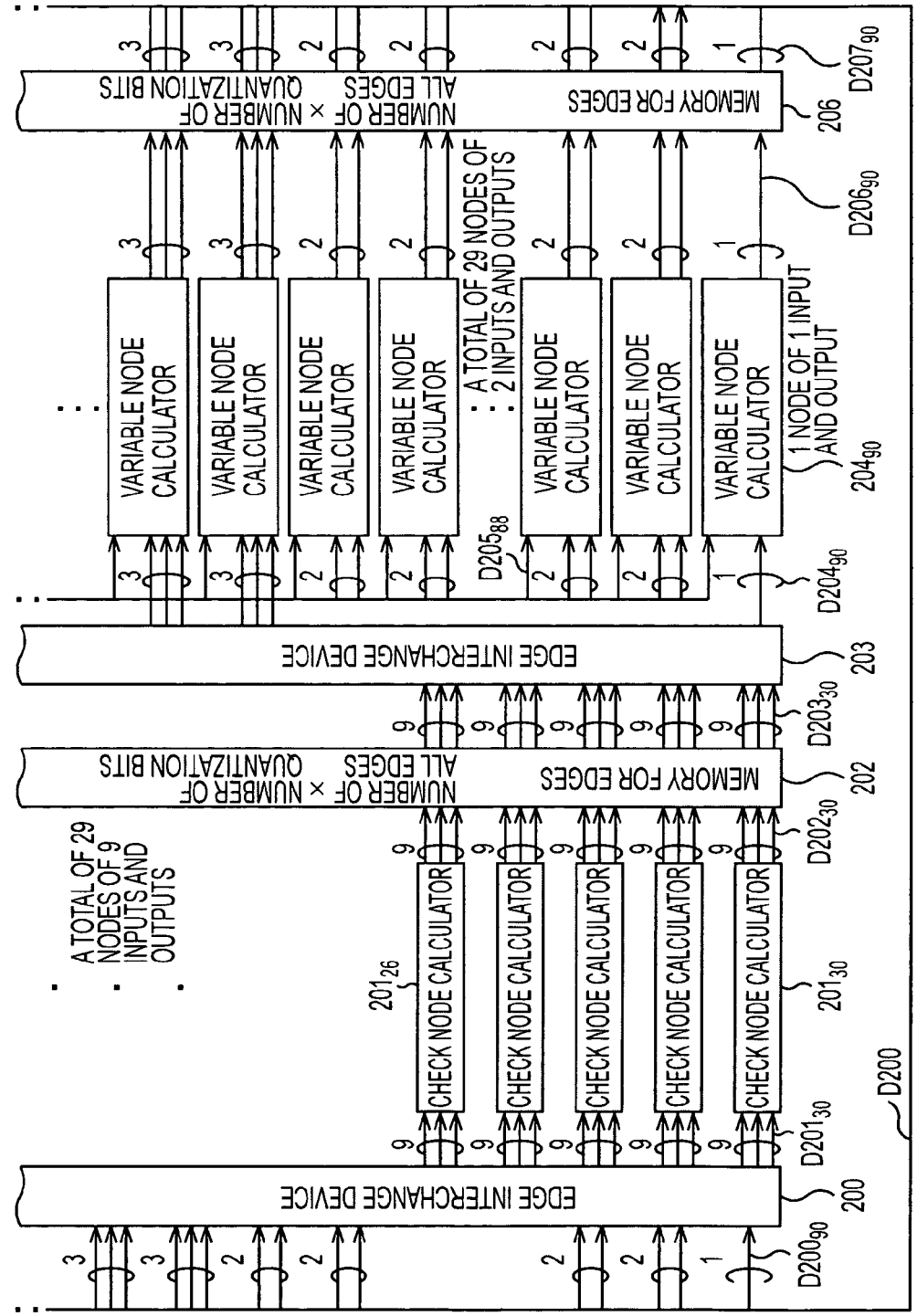
FIG. 12C is a block diagram showing an example of the configuration of the LDPC code decoding apparatus for simultaneously performing all node computations.
Figure 13:
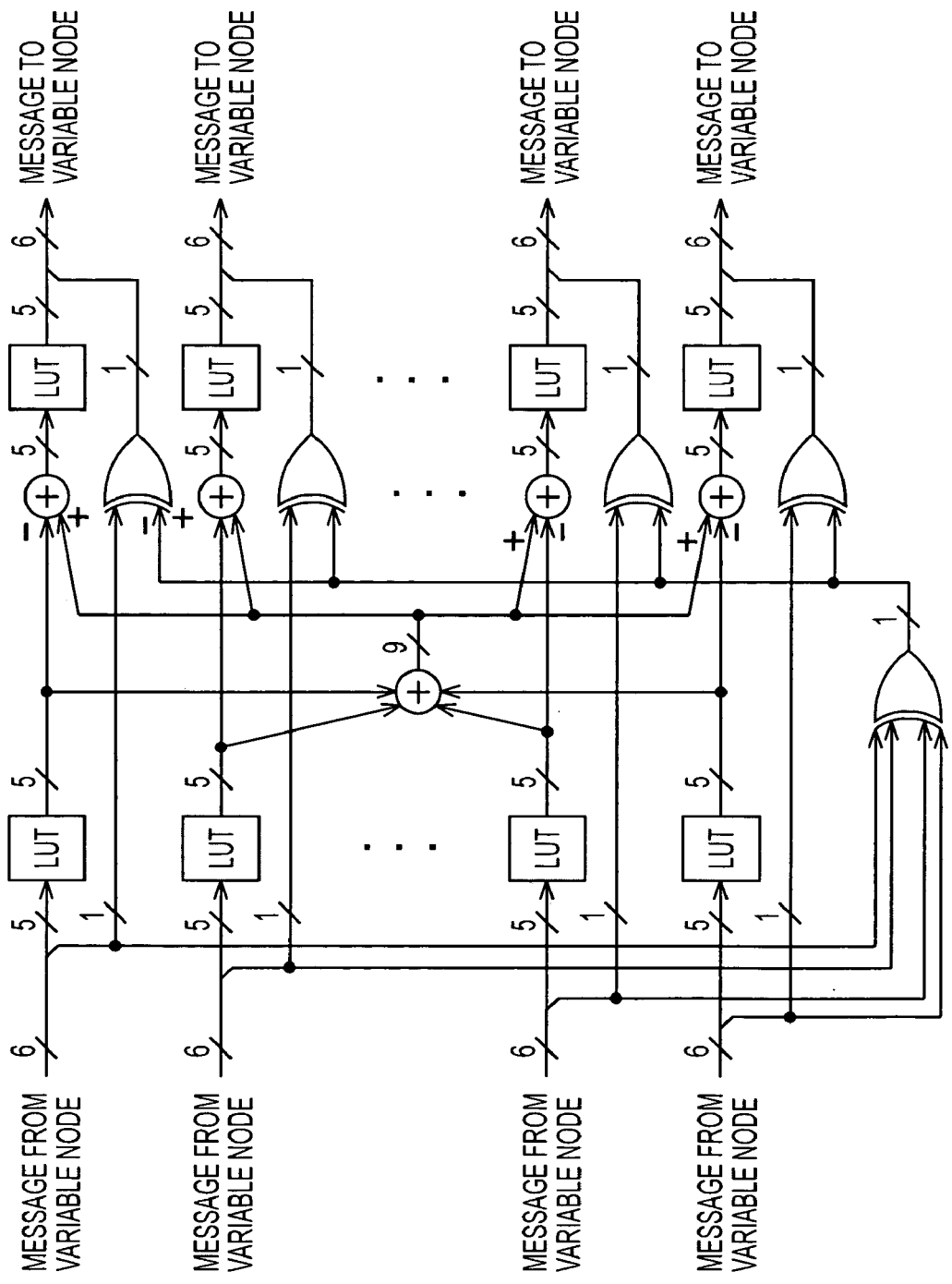
FIG. 13 is a block diagram showing an example of the configuration of a check node calculator for simultaneously calculating messages.
Figure 14:
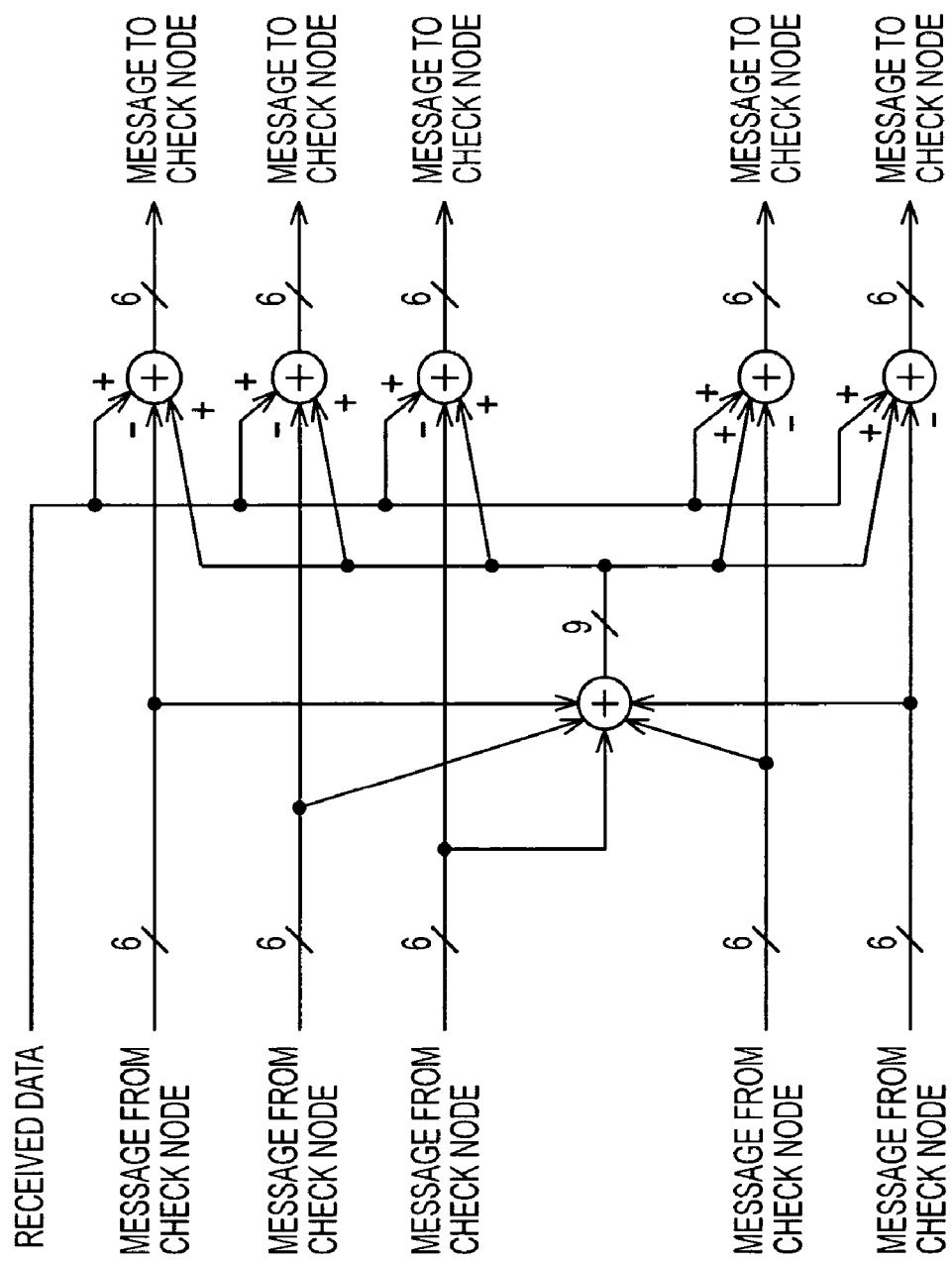
FIG. 14 is a block diagram showing an example of the configuration of a variable node calculator for simultaneously calculating messages.

Here, the variable node calculators $307_1$ to $307_5$ are each configured the same as the variable node calculator 103 of FIG. 11.

The cyclic shift circuit 308 cyclically shifts messages $D310_1$ to $D310_5$ calculated by the variable node calculator 307 on the basis of the information as to how many the unit matrix in which the corresponding edge is the origin in the check matrix is cyclically shifted, and supplies the result as a message D311 to the memory 300 for storing edge data.

As a result of the above operation being circulated once, one decoding of the LDPC codes can be performed. After the decoding apparatus of FIGS. 18A to 18C decodes the LDPC codes a predetermined number of times, in the decoded word calculation section 309 and the decoded data rearranging section 311, a final decoded result is determined and output.

More specifically, the decoded word calculation section 309 includes five decoded word calculation sections $309_1$ to $309_5$. At the final stage of a plurality of decodings, by using five messages D308 ($D308_1$ to $D308_5$) output from the selector 305 and five reception LLR D309 supplied from the memory 306 for received data, the decoded word calculation section 309 calculates the decoded result (decoded word) in accordance with equation (5), and supplies the decoded data D315 obtained thereby to the decoded data rearranging section 311.

The decoded data rearranging section 311 rearranges the order of the decoded data D315 by performing an inverse permutation of the column permutation of equation (9) on the decoded data D315 supplied from the decoded word calculation section 309, and outputs it as the final decoded result D316.

For the portions in which edge data (messages corresponding to the edge) lacks, during storage in the memory (when data is stored in the memories 300 and 304 for storing edge data), no message is stored. During node computation (during the check node computation at the check node calculator 302 and during the variable node computation at the variable node calculator 307), no computation is performed.

If a barrel shifter is used for the cyclic shift circuits 303 and 308, a desired operation can be realized while reducing the circuit scale.

In the above description, an FIFO is used to store edge data (the memories 300 and 304 for storing edge data are formed by FIFOs), but a RAM may be used instead of an FIFO. In that case, the RAM requires a bit width and a number of words of the total number of edges/p, at which p pieces of edge information (messages corresponding to the edges), can be simultaneously read. For writing into the RAM, at which position the data to be written is read when it is read next is determined, and the data is written at that position. For reading from the RAM, data is sequentially read from the beginning of the address. If the RAM is used in place of the FIFO, the selectors 301 and 305 are not necessary.

When the physical bit width of the FIFO and the RAM is not sufficient, by providing the same control signal by using a plurality of RAMs, these can be logically assumed as one RAM.

In the above-described case, for the simplification of description, a case in which p is 5, that is, the number of the rows and the number of the columns of the formation matrix forming the check matrix is 5, is used as an example. However, the number p of the rows and columns of the formation matrix is not always necessary to be 5, and it can take a different value depending on the check matrix. For example, p may be 360 or 392.

In this embodiment, although LDPC codes of a code length of 90 and a coding rate of ⅔ are used, the code length and the coding rate of the LDPC codes may be any value. For example, when the number p of the rows and columns of the formation matrix is 5, if the total number of edges is less than or equal to 5, LDPC codes of any code length and coding rate can be decoded by using the decoding apparatus of FIGS. 18A to 18C by only changing the control signal.

The decoding apparatus for particular LDPC codes, that satisfy conditions in which the number p of the rows and columns of the formation matrix is a predetermined value and the total number of edges is less than or equal to a particular value, is able to decode the LDPC codes of any desired coding rate at any desired code length, which satisfy the conditions.

As described above, one of or both a row permutation and a column permutation is performed on a check matrix (original check matrix), so that the check matrix is transformed to a check matrix (transformation check matrix) that can be represented by a combination of a P×P unit matrix, a quasi-unit matrix in which one or more is, which are elements of the unit matrix, are substituted with 0, a shift matrix in which the unit matrix or the quasi-unit matrix is cyclically shifted, a sum matrix, which is the sum of two or more of the unit matrix, the quasi-unit matrix, and the shift matrix, and a P×P 0-matrix, that is, a combination of formation matrices. Thus, for decoding LDPC codes, architecture for simultaneously performing p check node computations and p variable node computations can be adopted. As a result, by simultaneously performing p node computations, the operating frequency can be suppressed within a feasible range. Thus, while a large number of iterative decodings can be performed, it is possible to prevent simultaneous access to different addresses from occurring during writing to and reading from the memory (FIFO and RAM).

That is, by performing one of or both the above-described row permutation and column permutation of the check matrix, it is possible to simultaneously perform p check node computations and p variable node computations. Furthermore, by simultaneously performing p node computations in this manner, the operating frequency can be suppressed within a feasible range. Thus, while a large number of iterative decodings can be performed, it is possible to prevent simultaneous access to different addresses from occurring during writing to and reading from the memory (FIFO and RAM).

Figure 9:
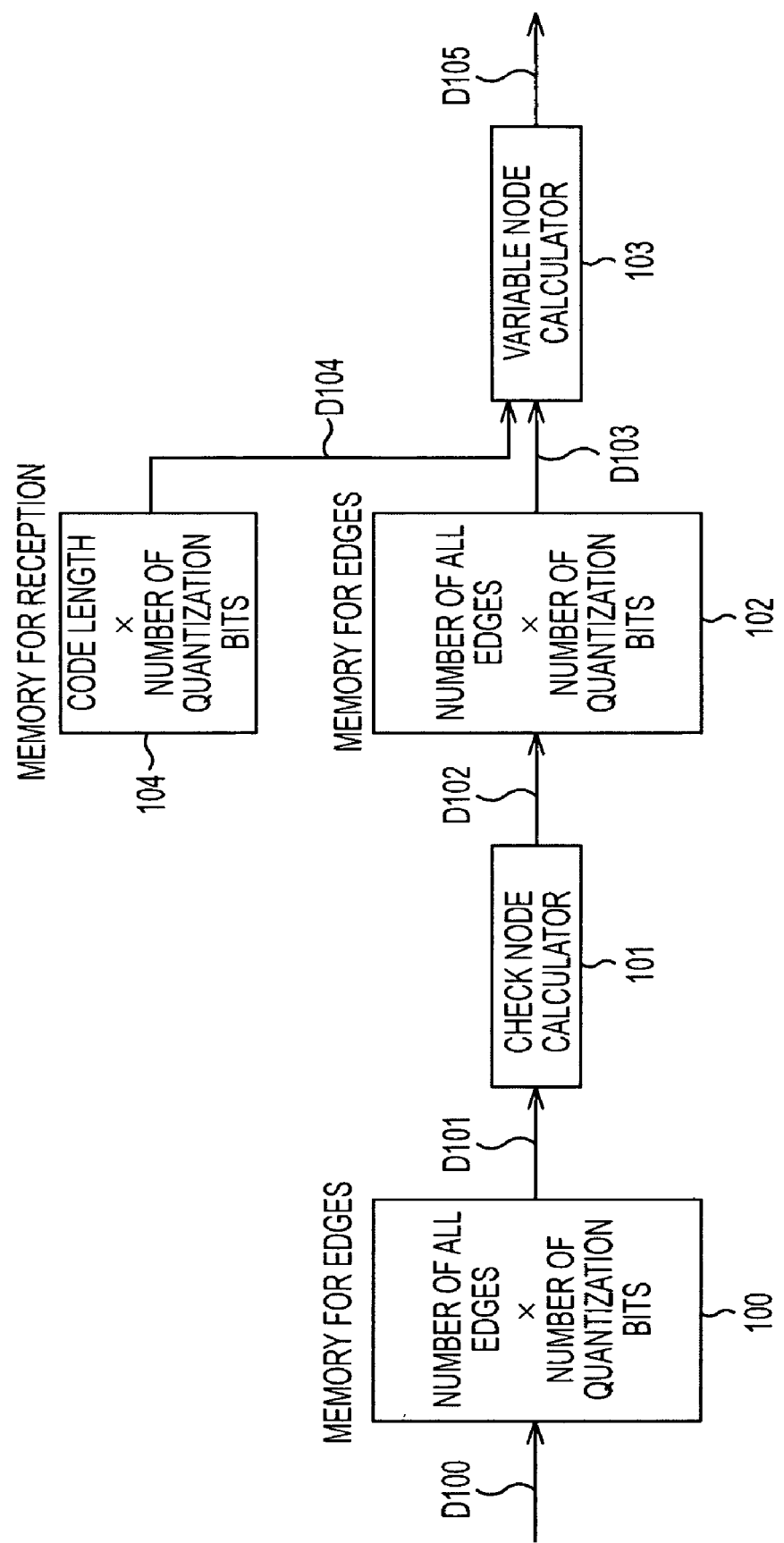
FIG. 9 is a block diagram showing an example of the configuration of an LDPC code decoding apparatus for performing node computations one-by-one.

When LDPC codes represented by the check matrix (transformation check matrix) of FIG. 17 are decoded, since it is possible to perform computations on 269 edges every five edges for each check node and each variable node. Therefore, for one decoding, the decoding apparatus needs to perform 269/5×2≅108 clock operations. Therefore, in order to perform 50 decodings, while 90 pieces of code information are received, the decoding apparatus needs to perform 108×50=5400 clock operations, and thus, an operating frequency approximately 60 times as high as the receiving frequency may be used. Therefore, according to the decoding apparatus of FIGS. 18A to 18C, when compared to the decoding apparatus of FIG. 9 for performing each node computation one-by-one, only an operating frequency of ⅕ is necessary. When viewed from the aspect of the circuit scale, since the size of the memory is the same, even if the logic circuit becomes large slightly, the influence on the whole is small.

In general, since the code length of LDPC codes is as large as several thousands to several tens of thousands, a matrix having a size whose value of p is several hundreds is used. In that case, the advantages that the decoding apparatus of the present invention is used are larger.

As described above, while the circuit scale for both logic and memory is suppressed, the operating frequency can be suppressed within a feasible range, and control of memory access can be performed easily.

From the properties of LDPC codes, even if a row permutation and a column permutation are performed on the check matrix, the performance of codes does not change. Therefore, for LDPC codes corresponding to the check matrix from which a transformation check matrix that can be represented by a combination of formation matrices is obtained by a row permutation and a column permutation, even if the LDPC codes have any code length and any coding length, the deterioration of performance is not caused to occur, the implementation is easy, and decoding can be performed with high efficiency.

Furthermore, since the decoding apparatus according to the present invention faithfully implements the sum product algorithm, decoding loss other than quantization of messages does not occur.

From the above viewpoints, by using the decoding apparatus according to the present invention, high-performance decoding becomes possible.

When the check matrix is not a multiple of the number p of the rows and columns of the formation matrix, the present invention may be applied by assuming the check matrix to be a multiple of p by assigning elements of all 0s to the outside of the fractions of the check matrix.

Next, the above-described series of processes can be performed by hardware, and it can also be executed by software. In a case where the series of processes is performed by software, the program forming the software is installed into a general-purpose computer, etc.

Accordingly, FIG. 19 shows an example of the configuration of an embodiment of a computer to which the program for executing the above-described series of processes is installed.

The program may be recorded in advance in a hard disk 405 and a ROM 403 serving as a recording medium incorporated in the computer.

Alternatively, the program can be temporarily or permanently stored (recorded) in a removable recording medium 411, such as a flexible disk, a CD-ROM (Compact Disc Read-Only Memory), an MO (Magneto optical) disk, a DVD (Digital Versatile Disc), a magnetic disk, or a semiconductor memory. Such a removable recording medium 411 can be provided as so-called packaged software.

In addition to being installed into a computer from the removable recording medium 411 such as that described above, programs can be transferred in a wireless manner from a download site via a man-made satellite for digital satellite broadcasting or can be transferred by wire to a computer via a network, such as a LAN (Local Area Network) or the Interne. In the computer, the programs which are transferred in such a manner can be received at a communication section 408, can be installed into the hard disk 405 contained therein.

The computer incorporates a CPU (Central Processing Unit) 402. An input/output interface 410 is connected to the CPU 402 via a bus 401. When an instruction is input by the user by operating an input section 407 including a keyboard, a mouse, a microphone, etc., via the input/output interface 410, the CPU 402 executes the program stored in the ROM (Read Only Memory) 403 in accordance with that instruction. Alternatively, the CPU 402 loads, into the RAM (Random Access Memory) 404, the program stored in the hard disk 405, the program that is transferred from a satellite or a network, that is received by the communication section 408, and that is installed into the hard disk 405, or the program that is read from the removable recording medium 411 loaded to a drive 409 and is installed into the hard disk 405, and executes the program. As a result, the CPU 402 performs processing in accordance with the above-described flowcharts or processing according to the above-described block diagrams. Then, for example, the CPU 402 outputs the processing result via the input/output interface 410 from an output section 406 including an LCD (Liquid-Crystal Display), a speaker, etc., or transmits it from the communication section 408, and further records it in the hard disk 405 as required.

In this specification, processing steps for writing the program for enabling the computer to perform various processing need not to be executed chronologically according to the written orders as flowcharts. Also, they may be executed concurrently or individually (for example, parallel processing or object-based processing).

The program may be processed by one computer or may be processed by a plurality of computers in a distributed manner. Furthermore, the program may be transferred to a distant computer and may be processed thereby.

INDUSTRIAL APPLICABILITY

As has thus been described, according to the present invention, while the circuit scale is suppressed, the operating frequency can be suppressed within a sufficiently feasible range, and control of memory access can be performed easily.

The invention claimed is:

1. A decoding method of decoding Low Density Parity Check ("LDPC") codes, the LDPC codes being represented by an original check matrix, said decoding method comprising:
    an obtaining step of permuting at least two columns or two rows of the original check matrix to obtain a transformation check matrix; and
    a decoding step of decoding said LDPC codes by using the obtained transformation check matrix.

2. The decoding method according to claim 1, wherein the transformation check matrix comprises a plurality of formation matrices, the formation matrix including one of a (P×P) unit matrix, a quasi-unit matrix, a shift matrix, a sum matrix, and a (P×P) zero matrix; wherein the quasi-unit matrix is a unit matrix having one or more 1s substituted by 0s, the shift matrix is a unit matrix or a quasi unit matrix being cyclically shifted, and the sum matrix is a sum of two or more of the unit matrix, the quai-unit matrix, and the shift matrix.

3. The decoding method according to claim 1, further comprising:
a code sequence permutation step of permutting two columns of a code sequence of the LDPC codes in the same manner as the obtaining step, and outputting the permuted code sequence, wherein
in the decoding step, the code sequence is decoded by using the transformation check matrix and the permuted code sequence.

4. A decoding apparatus for decoding Low Density Parity Check ("LDPC") codes, the LDPC codes being represented by an original check matrix, said decoding apparatus comprising:
obtaining means for permuting at least two columns or two rows of the original check matrix to obtain a transformation check matrix; and
decoding means for decoding said LDPC codes by using the obtained transformation check matrix.

5. The decoding apparatus according to claim 4, wherein the transformation check matrix comprises a plurality of formation matrices, the formation matrix including one of a (P×P) unit matrix, a quasi-unit matrix, a shift matrix, a sum matrix, and a (P×P) zero matrix; wherein the quasi-unit matrix is a unit matrix having one or more 1s substituted by 0s, the shift matrix is a unit matrix or a quasi unit matrix being cyclically shifted, and the sum matrix is a sum of two or more of the unit matrix, the quai-unit matrix, and the shift matrix.

6. The decoding apparatus according to claim 5, wherein said decoding means comprises:
check node calculation means for simultaneously performing p check node computations for decoding said LDPC codes; and
variable node calculation means for simultaneously performing p variable node computations for decoding said LDPC codes.

7. The decoding apparatus according to claim 6, wherein said check node calculation means comprises p check node calculators for performing computations of check nodes; and
said variable node calculation means comprises p variable node calculators for performing computations of variable nodes.

8. The decoding apparatus according to claim 6, wherein said decoding means further comprises message storage means for simultaneously reading and writing message data corresponding to p edges obtained as a result of said computations of the p check nodes or the p variable nodes.

9. The decoding apparatus according to claim 8, wherein said message storage means stores message data corresponding to the edges which are read during a check node computation in such a manner that is of said transformation check matrices are padded closer in the row direction.

10. The decoding apparatus according to claim 8, wherein said message storage means stores message data corresponding to the edges which are read during a variable node computation in such a manner that is of said transformation check matrix is padded closer in the column direction.

11. The decoding apparatus according to claim 8, wherein said message storage means stores, at the same address, messages corresponding to p edges belonging to a unit matrix, a quasi-unit matrix, or a shift matrix whose weight is 1 when the formation matrices, whose weight is 2 or more, representing said transformation check matrix are represented in the form of the sum of the unit matrix, the quasi-unit matrix, or the shift matrix, whose weight is 1.

12. The decoding apparatus according to claim 8, wherein said message storage means comprises number-of-the-rows/p FIFOs and number-of-the-columns/p FIFOs; and
said number-of-the-rows/p FIFOs and said number-of-the-columns/p FIFOs each have a number of words corresponding to the weight of the rows and columns of said check matrix, respectively.

13. The decoding apparatus according to claim 8, wherein said message storage means comprises a Random Access Memory ("RAM"), and said RAM stores said message data in such a manner as to be padded closer in the read-out sequence and reads said message data in the storage position sequence.

14. The decoding apparatus according to claim 6, wherein said decoding means further comprises received information storage means for storing received information and simultaneously reading p pieces of the received information.

15. The decoding apparatus according to claim 14, wherein
said received information storage means stores said received information in such a manner that said received information can be read in the sequence necessary for said computations of variable nodes.

16. The decoding apparatus according to claim 6, wherein said decoding means further comprises cyclic shift means for cyclically shifting messages obtained as a result of said p check node computations or said p variable node computations.

17. The decoding apparatus according to claim 16, wherein
said cyclic shift means comprises a barrel shifter.

18. The decoding apparatus according to claim 4, further comprising:
code sequence permutation means for performing, on the code sequence of said received LDPC codes, the same column permutation as the column permutation performed on said original check matrix and outputting a permuted code sequence, wherein
said decoding means decodes said code sequence by using said transformation check matrix and said permuted code sequence.

19. The decoding apparatus according to claim 18, further comprising:
inverse permutation means for performing, on the output of said decoding means, an inverse permutation of a column permutation performed on said original check matrix, and for outputting a final decoded result.

20. A computer readable media storing a program for causing a computer to perform a decoding method for use with a decoding apparatus for decoding Low Density Parity Check ("LDPC") codes, the LDPC codes being represented by an original check matrix, said method comprising:
an obtaining step of permuting at least two columns or two rows of the original check matrix to obtain a transformation check matrix; and
a decoding step of decoding said LDPC codes by using the obtained transformation check matrix.

* * * * *